(12) United States Patent
Kondo et al.

(10) Patent No.: US 12,069,962 B2
(45) Date of Patent: Aug. 20, 2024

(54) MAGNETIC MEMORY

(71) Applicant: Kioxia Corporation, Tokyo (JP)

(72) Inventors: Tsuyoshi Kondo, Kawasaki Kanagawa (JP); Nobuyuki Umetsu, Kawasaki Kanagawa (JP); Yasuaki Ootera, Yokohama Kanagawa (JP); Tsutomu Nakanishi, Yokohama Kanagawa (JP); Shigeyuki Hirayama, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 477 days.

(21) Appl. No.: 17/196,737

(22) Filed: Mar. 9, 2021

(65) Prior Publication Data

US 2022/0077383 A1    Mar. 10, 2022

(30) Foreign Application Priority Data

Sep. 8, 2020 (JP) ................. 2020-150768

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/22* (2023.02); *H10N 50/01* (2023.02)

(58) Field of Classification Search
None
See application file for complete search history.

(56) References Cited

U.S. PATENT DOCUMENTS

| | | |
|---|---|---|
| 6,621,730 B1 | 9/2003 | Lage |
| 8,830,718 B2 | 9/2014 | Kondo et al. |
| 9,184,212 B2 | 11/2015 | Morise et al. |
| 9,293,696 B2 | 3/2016 | Ootera et al. |
| 10,032,499 B2 | 7/2018 | Kado et al. |
| 2014/0085970 A1 | 3/2014 | Kondo et al. |

(Continued)

FOREIGN PATENT DOCUMENTS

| | | |
|---|---|---|
| JP | 2014-63936 A | 4/2014 |
| JP | 2017-143175 A | 8/2017 |

(Continued)

OTHER PUBLICATIONS

T. Nozaki, et al.; "Recent Progress in the Voltage-Controlled Magnetic Anisotropy Effect and the Challenges Faced in Developing Voltage-Torque MRAM," Micromachines, vol. 10, No. 327, 31 pages (2019).

*Primary Examiner* — Nilufa Rahim
(74) *Attorney, Agent, or Firm* — Finnegan, Henderson, Farabow, Garrett & Dunner, LLP

(57) ABSTRACT

A magnetic memory according to an embodiment includes: a first wiring and a second wiring; a nonmagnetic conductor extending in a first direction; a first magnetic member including a first portion electrically connected to the first wiring and a second portion electrically connected to the second wiring, the first magnetic member extending in the first direction from the first portion to the second portion to surround the nonmagnetic conductor; an insulation portion disposed between the nonmagnetic conductor and the first magnetic member; and a controller electrically connected to the nonmagnetic conductor, the first wiring, and the second wiring.

14 Claims, 24 Drawing Sheets

(56) References Cited

U.S. PATENT DOCUMENTS

2018/0358104 A1* 12/2018 Ootera .................. H10N 50/01
2019/0088346 A1* 3/2019 Ootera .................. H10N 50/85
2020/0303026 A1* 9/2020 Hashimoto ......... G11C 11/1673

FOREIGN PATENT DOCUMENTS

| JP | 6172850 B2 | 8/2017 |
| JP | 6271350 B2 | 1/2018 |

* cited by examiner

SEQUENCE OF $V_C$

1ST EXAMPLE OF SEQUENCE OF $I_S$

2ND EXAMPLE OF SEQUENCE OF $I_S$

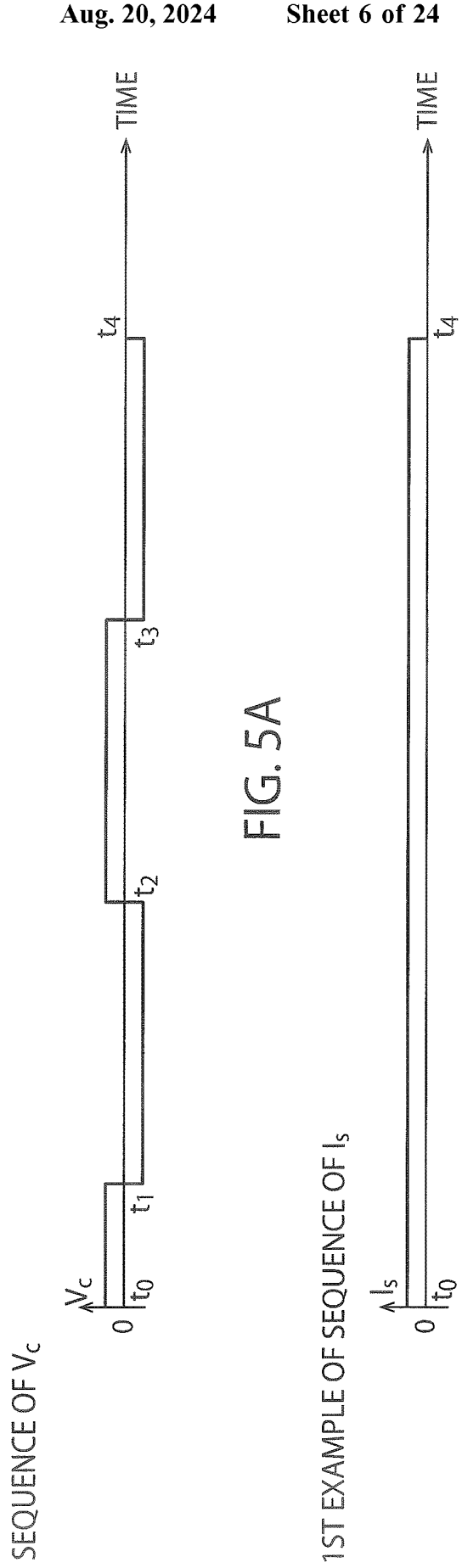

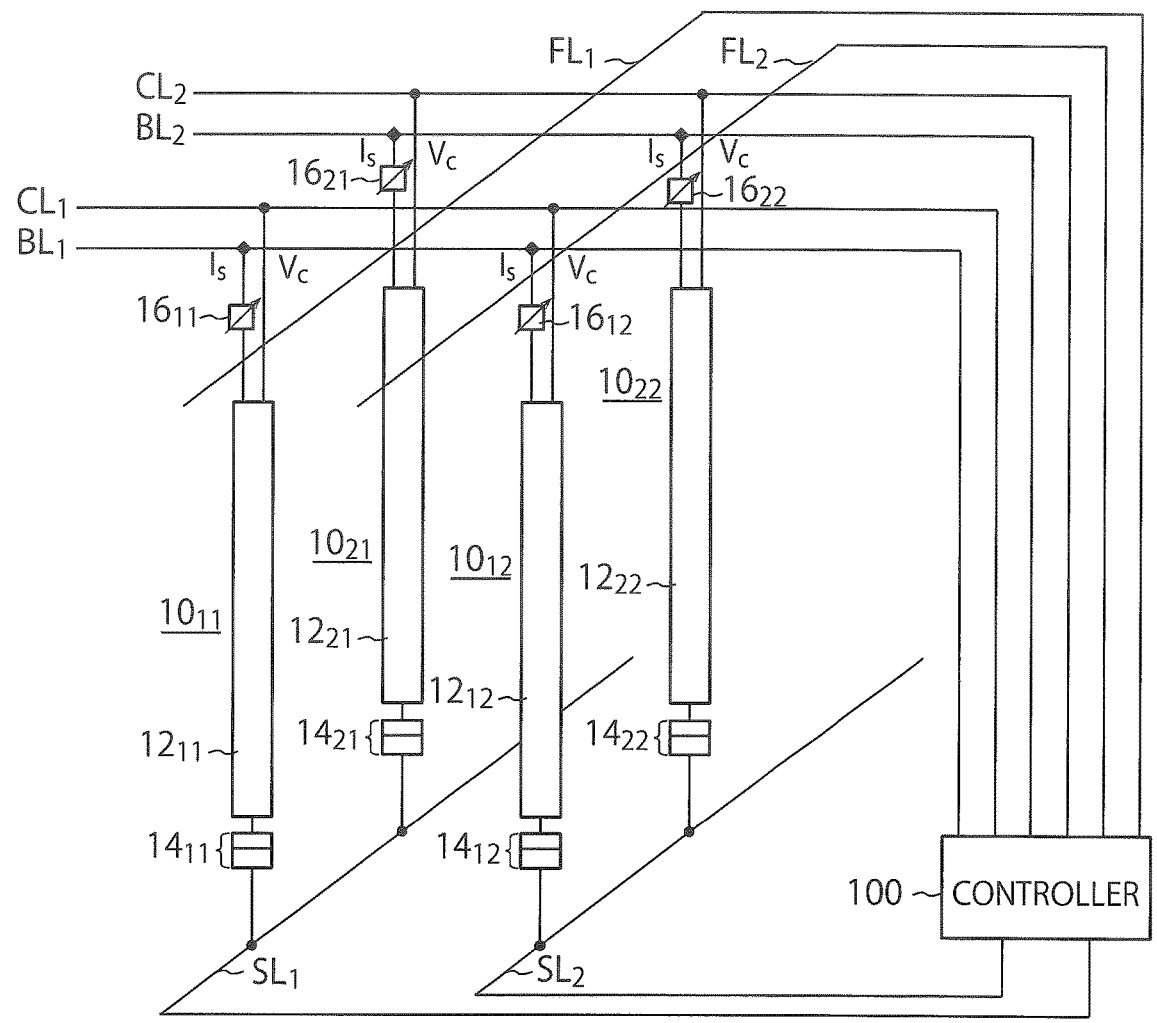
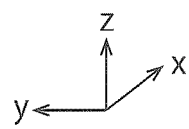
FIG. 23 ated to one end and a second wiring is electrically connected to the other end of the magnetic member. The domain walls are moved by causing a shift current for shifting the domain walls of the magnetic member to flow between the one end and the other end of the magnetic member.
MAGNETIC MEMORY

CROSS REFERENCE TO RELATED APPLICATIONS

This application is based upon and claims the benefit of priority from the prior Japanese Patent Application No. 2020-150768, filed on Sep. 8, 2020, the entire contents of which are incorporated herein by reference.

FIELD

Embodiments described herein relate generally to magnetic memories.

BACKGROUND

Magnetic memories in which domain walls of a magnetic member are moved (shifted) by a current flowing through the magnetic member are known. In such a magnetic memory, for example, a first wiring is electrically connected to one end and a second wiring is electrically connected to the other end of the magnetic member. The domain walls are moved by causing a shift current for shifting the domain walls of the magnetic member to flow between the one end and the other end of the magnetic member.

The magnetic memories including the above-described structure have a problem of the occurrence of shift error.

BRIEF DESCRIPTION OF THE DRAWINGS

FIGS. 5A and 5B are waveform diagrams for explaining a second example of the shift operation.

FIG. 23 is a circuit diagram showing the structure of a magnetic memory according to a modification of the second embodiment.

DETAILED DESCRIPTION

A magnetic memory according to an embodiment includes: a first wiring and a second wiring; a nonmagnetic conductor extending in a first direction; a first magnetic member including a first portion electrically connected to the first wiring and a second portion electrically connected to the second wiring, the first magnetic member extending in the first direction from the first portion to the second portion to surround the nonmagnetic conductor; an insulation portion disposed between the nonmagnetic conductor and the first magnetic member; and a controller electrically connected to the nonmagnetic conductor, the first wiring, and the second wiring.

First Embodiment

Figure 1:
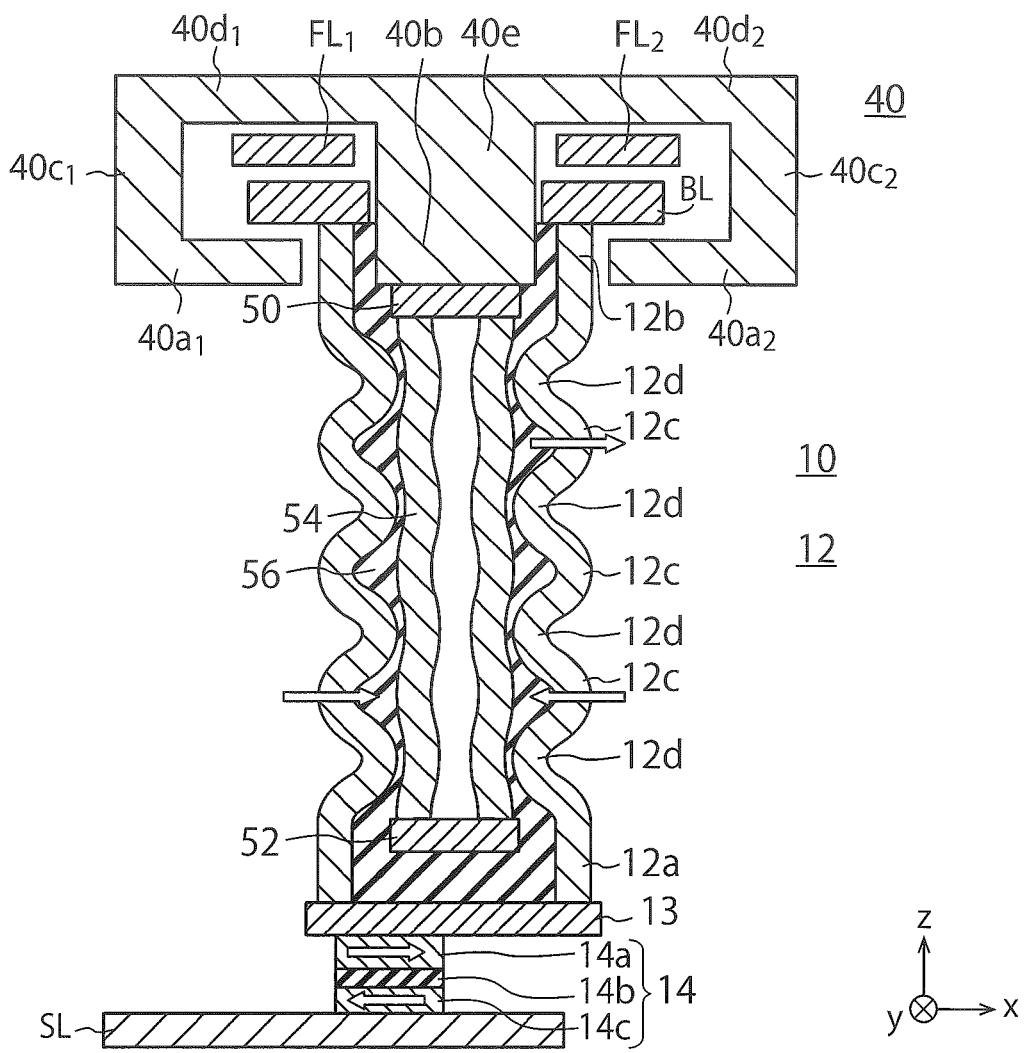
FIG. 1 is a cross-sectional view of a magnetic memory according to a first embodiment.

FIG. 1 shows a magnetic memory according to a first embodiment. The magnetic memory according to the first embodiment includes a memory cell 10. The memory cell 10 includes a magnetic member (magnetic memory line) 12, a nonmagnetic conductive layer 13, a magnetoresistive element 14, a yoke 40, a nonmagnetic conductive layer 50, a nonmagnetic conductive layer 52, a nonmagnetic conductor 54, a bit line BL, and a source line SL.

The magnetic member 12 is a cylindrical perpendicular magnetic member including a first end portion 12a and a second end portion 12b, and extending in a first direction (z direction) from the first end portion 12a to the second end portion 12b. The outer shape of the cross section of the magnetic member 12 taken along a plane that is perpendicular to the z direction may be, for example, a circle, an oval, or a polygon. The magnetic member 12 is formed of a perpendicular magnetic member. Therefore, the easy magnetization axis of the magnetic member 12 is perpendicular to the z direction. The magnetization direction of the magnetic member 12 is therefore in a diameter direction as shown by arrows in FIG. 1. The diameter direction means either an outward direction or an inward direction.

The magnetic member 12 includes a plurality of regions 12c arranged in the z direction. A narrow portion 12d is provided between two adjacent regions 12c, on the outer surface of the magnetic member 12. The regions 12c have at least one magnetic domain. When a drive current (shift current) is supplied between the first end portion 12a and the second end portion 12b of the magnetic member 12, the domain wall of the magnetic member 12 moves in the z direction. When no drive current is supplied, the domain wall stops at any of the narrow portion 12d. The first end portion 12a of the magnetic member 12 is electrically connected to the magnetoresistive element 14, and the second end portion 12b is electrically connected to the bit line BL. The description "A and B are electrically connected" herein means that A and B may be directly connected or indirectly connected via such an element as a conductor, a resistance changing member (including a magnetoresistive element), and a switching element (for example, a selector or a transistor). The nonmagnetic conductive layer 13 is disposed between the first end portion 12a and the magnetoresistive element 14 as shown in FIG. 1. The nonmagnetic conductive layer 13 may be used as a bit line.

Figure 22:
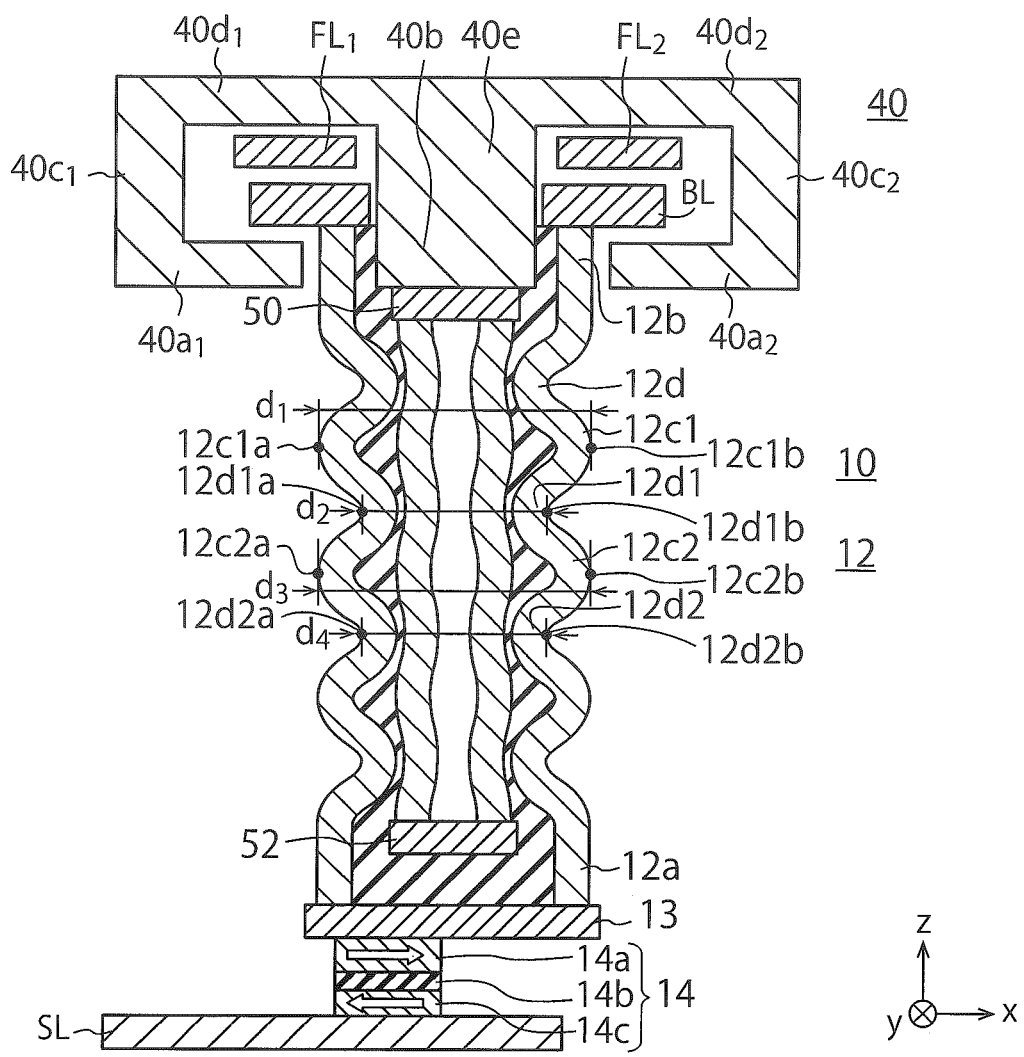
FIG. 22 is a diagram for explaining the sizes of regions and narrow portions of a magnetic member in the x-y plane.

FIG. 22 shows that a region 12c1, a narrow portion 12d1, a region 12c2, and a narrow portion 12d2 are arranged in the z direction in the magnetic member 12. In a cross section taken along the z direction and including the magnetic member 12, the nonmagnetic conductor 54, which will be described later, and an insulating film 56, which will be described later, a length in an x direction between an end portion 12c1a and an end portion 12c1b of the region 12c1 is denoted as d1, a length in the x direction between an end portion 12d1a and an end portion 12d1b of the narrow portion 12d1 is denoted as d2, a length in the x direction between an end portion 12c2a and an end portion 12c2b of the region 12c2 is denoted as d3, and a length in the x direction between an end portion 12d2a and an end portion 12d2b of the narrow portion 12d2 is denoted as d4. The lengths meet the following conditions:

$d1 > d2, d4$ $d3 > d2, d4.$

The magnetoresistive element 14 is used to read information written to the magnetic member 12, and may be a magnetic tunnel junction (MTJ) element, for example. In the following descriptions, the magnetoresistive element 14 is assumed to be an MTJ element. The MTJ element 14 includes a free layer (magnetization free layer) 14a, in which the magnetization direction may be changed, a fixed layer (magnetization fixed layer) 14c, in which the magnetization direction is fixed, and a nonmagnetic insulating layer (tunnel barrier layer) 14b disposed between the free layer 14a and the fixed layer 14c. In the MTJ element 14, the free layer 14a is electrically connected to the first end portion 12a of the magnetic member 12 via the nonmagnetic conductive layer 13, and the fixed layer 14c is electrically connected to the source line SL. The fixed layer 14c may be electrically connected to the bit line instead of the source line SL. In this case, the second end portion 12b may be electrically connected to the bit line BL. The feature that "the magnetization direction may be changed" herein means that in a read operation described later, the magnetization direction may be changed by a stray magnetic field from the magnetic member 12, and the feature that "magnetization direction is fixed" means that the magnetization direction is not changed by the stray magnetic field from the magnetic member 12.

The bit line BL extends in a y direction, and has an opening at a central portion thereof. The diameter of the opening is equal to or smaller than the inner diameter of the cylindrical shape of the magnetic member 12. The second end portion 12b of the magnetic member 12 is electrically connected to a region of the bit line BL around the opening. Field lines $FL_1$ and $FL_2$ are disposed above the bit line BL. The field lines $FL_1$ and $FL_2$ extend in the y direction.

The yoke 40 is formed of, for example, a soft magnetic material, and disposed to surround a part of each of the bit line BL and the field lines $FL_1$ and $FL_2$. The yoke 40 includes first portions $40a_1$ and $40a_2$, a second portion 40b, third portions $40c_1$ and $40c_2$, fourth portions $40d_1$ and $40d_2$, and a fifth portion 40e. The first portion $40a_1$ and the first portion $40a_2$ are disposed on opposite sides of the magnetic member 12 near the second end portion 12b, and extend in the x direction. They are also disposed on the lower surface side of the bit line BL. In other words, the first portion $40a_1$ and the first portion $40a_2$ are disposed so that one ends thereof are located on the opposite sides of the magnetic member 12 so as to sandwich the second end portion 12b of the magnetic member 12.

The second portion 40b is disposed within the cylindrical shape of the magnetic member 12 near the second end portion 12b, and connected to the fifth portion 40e. The second portion 40b and the fifth portion 40e are arranged in the z direction to penetrate the opening of the bit line BL, and electrically insulated from the bit line BL.

The third portion $40c_1$ extends in the z direction with one end thereof being connected to the other end of the first portion $40a_1$. The third portion $40c_2$ extends in the z direction with one end being connected to the other end of the first portion $40a_2$. The fourth portion $40d_1$ extends in the x direction with one end being connected to the other end of the third portion $40c_1$. The fourth portion $40d_2$ extends in the x direction with one end being connected to the other end of the third portion $40c_2$. The fifth portion 40e extends in the z direction and connected to the other end of each of the fourth portions $40d_1$ and $40d_2$.

The first portion $40a_1$, the third portion $40c_1$, the fourth portion $40d_1$, the fifth portion 40e, and the second portion 40b surround a part of the field line $FL_1$, and the first portion $40a_2$, the third portion $40c_2$, the fourth portion $40d_2$, the fifth portion 40e, and the second portion 40b surround a part of the field line $FL_2$. Furthermore, the first portion $40a_1$, the third portion $40c_1$, the fourth portion $40d_1$, the fifth portion 40e, and the second portion 40b constitute a first magnetic circuit, which increases the strength of a magnetic field induced by a write current supplied to the field line $FL_1$ from a controller 100 shown in FIG. 2, which will be described later, and supplies the increased magnetic field to the second end portion of the magnetic member 12. The first portion $40a_2$, the third portion $40c_2$, the fourth portion $40d_2$, the fifth portion 40e, and the second portion 40b constitute a second magnetic circuit, which increases the strength of a magnetic field induced by a write current supplied to the field line $FL_2$ from the controller 100, and supplies the increased magnetic field to the second end portion of the magnetic member 12.

The nonmagnetic conductive layer 50 is disposed within the cylindrical shape of the magnetic member 12, and electrically connected to the second portion 40b of the yoke 40. The nonmagnetic conductive layer 52 is disposed within the cylindrical shape of the magnetic member 12.

The nonmagnetic conductor 54 is disposed in the z direction in the cylindrical shape of the magnetic member 12 with one end connected to the nonmagnetic conductive layer 50 and the other end connected the nonmagnetic conductive layer 52. The nonmagnetic conductor 54 is electrically insulated from the magnetic member 12 by the insulating film 56. The thickness of the insulating film 56 at a portion corresponding to the narrow portion 12d of the magnetic member 12 is preferably less than the thickness at a portion corresponding to the region 12c.

Figure 2:
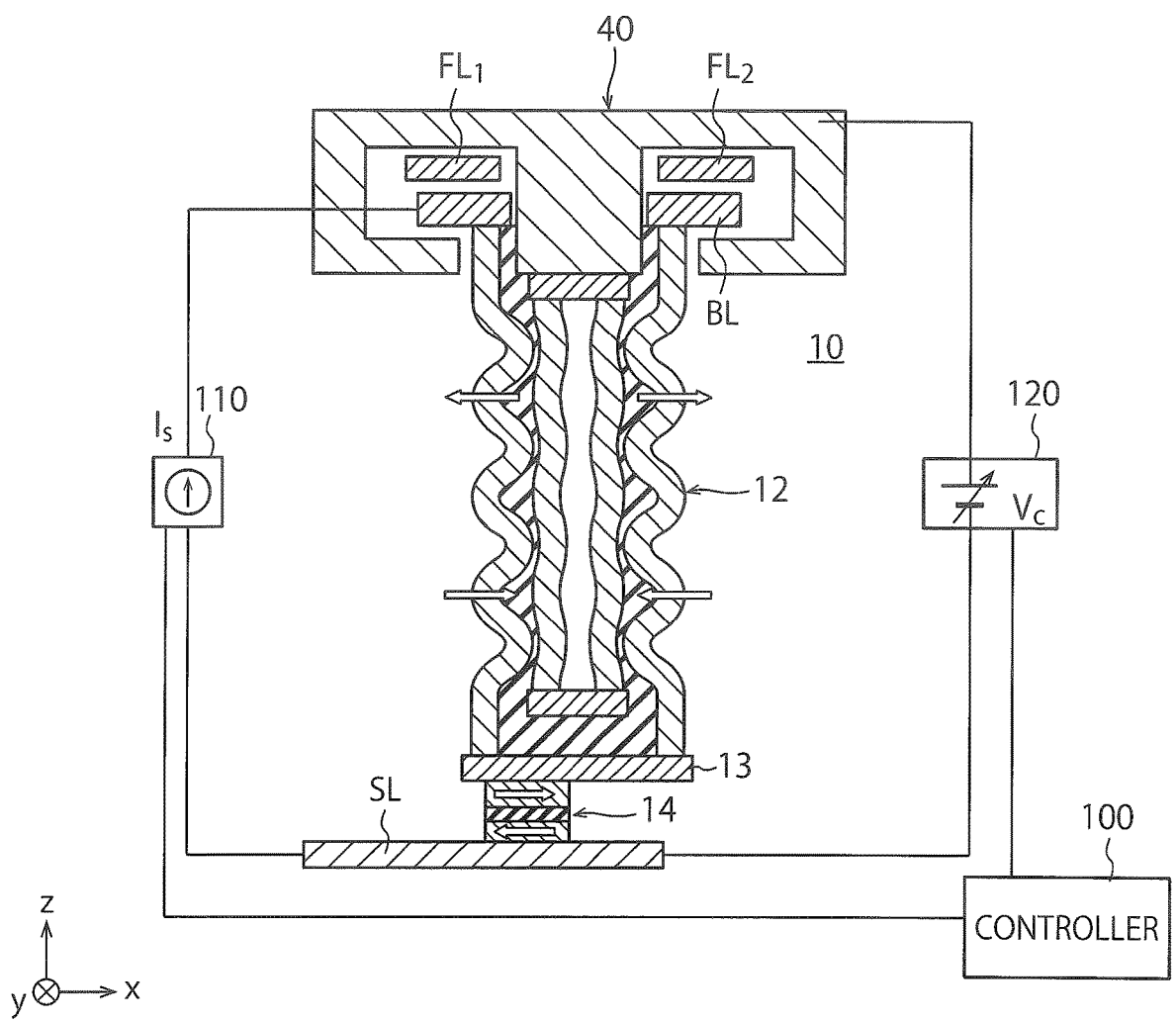
FIG. 2 is a diagram for explaining an operation of the magnetic memory according to the first embodiment.

As shown in FIG. 2, the magnetic memory according to the first embodiment includes a shift current supply circuit 110 that supplies a shift current between the bit line BL and the source line SL for moving (shifting) the domain wall of the magnetic member 12, and a voltage supply circuit 120 that supplies a voltage between the yoke 40 and the source line SL. The voltage supply circuit 120 may be electrically connected to the bit line BL. In such a case, a voltage is supplied between the yoke 40 and the bit line BL. The magnetic memory also includes the controller 100 for controlling the shift current supply circuit 110 and the voltage supply circuit 120. The controller 100 supplies the write currents to the field lines $FL_1$ and $FL_2$.

(Write Operation)

A write operation will now be described. The controller 100 supplies write currents that flow in the field lines $FL_1$ and $FL_2$ in opposite directions to generate an induced magnetic field. The induced magnetic field is enhanced by the first magnetic circuit and the second magnetic circuit surrounding the field lines $FL_1$ and $FL_2$ and conveyed to the second end portion 12b of the magnetic member 12 to write information (magnetization direction) to the second end portion 12b. The shift current supply circuit 110 is then used to supply a shift current Is between the bit line BL and the source line SL to move the domain wall. The written information may be moved to the first end portion 12a side of the magnetic member 12 in this manner, and then new information may be written to the second end portion 12b.

During the write operation, a current may be caused to flow through the magnetic member 12 via the MTJ element 14 to perform magnetization switching caused by spin transfer. The same applies to other embodiments.

(Read Operation)

A read operation will then be described. First, the shift current supply circuit 110 is used to cause a shift current Is to flow between the bit line BL and the source line SL to move the domain wall, thereby moving information to be read to the first end portion 12a of the magnetic member 12. The distance the domain wall moves is proportional to the time during which the shift current Is is applied. When the shift current Is is stopped, the domain wall moves to the nearest narrow portion 12d of the magnetic member 12 and stops there. In the first embodiment, when the shift current Is is supplied, the voltage supply circuit 120 applies the voltage Vc between the yoke 40 and the source line SL. As a result, the voltage Vc is applied between the magnetic member 12 that is electrically connected to the source line SL and the nonmagnetic conductor 54 that is electrically connected to the yoke 40.

Figure 3A:
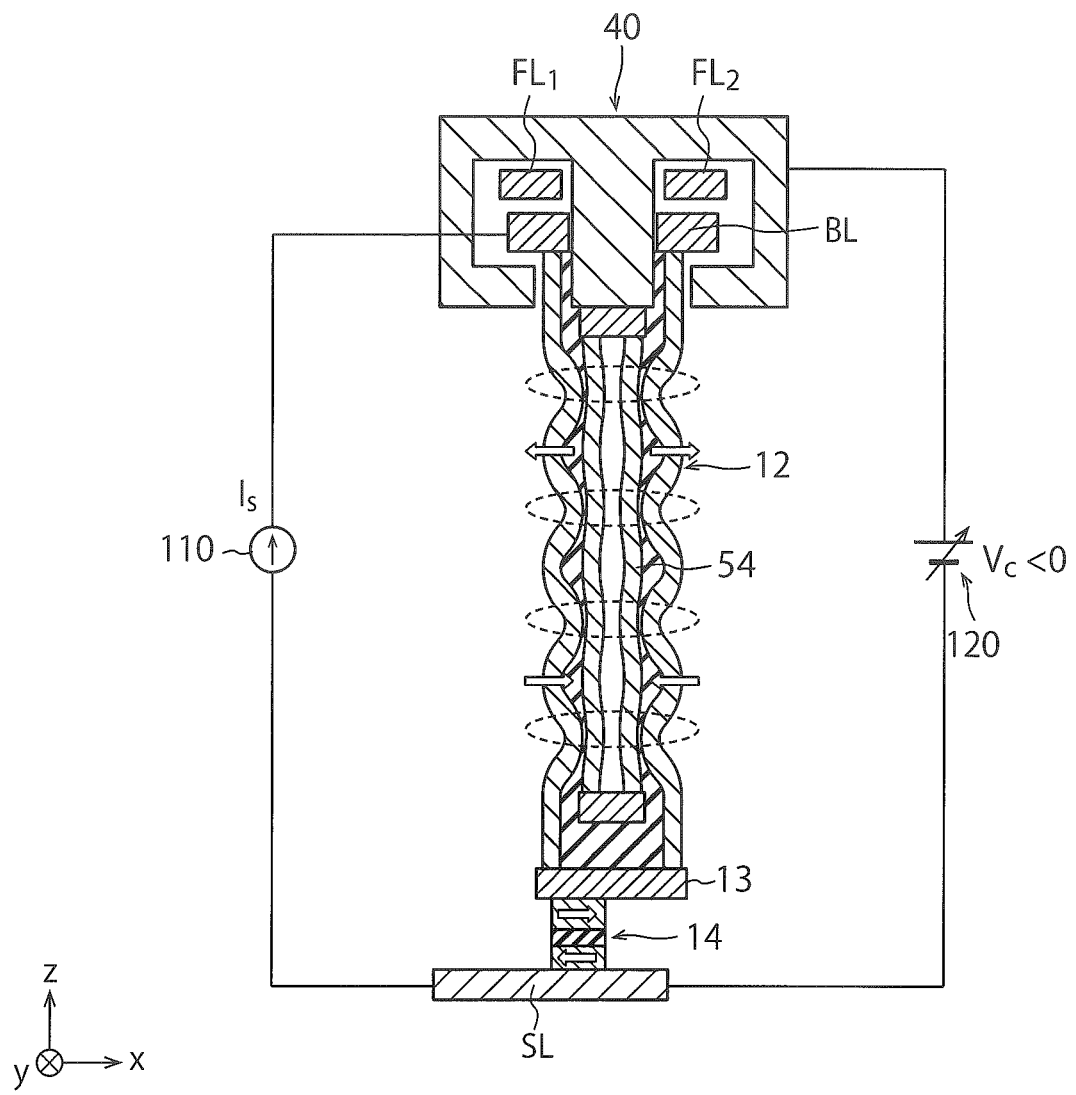
FIGS. 3A and 3B are diagrams for explaining the effects of applying a voltage to the magnetic memory according to the first embodiment.

As shown in FIG. 3A for example, if the voltage Vc applied between the magnetic member 12 and the nonmagnetic conductor 54 is a negative voltage, i.e., if the potential applied to the magnetic member 12 is higher than the potential applied to the nonmagnetic conductor 54, the magnetic anisotropy of the magnetic member 12 increases, and therefore the domain wall is more likely to stop. This may prevent the occurrence of a shift error more reliably than the case where no voltage Vc is applied.

Figure 3B:
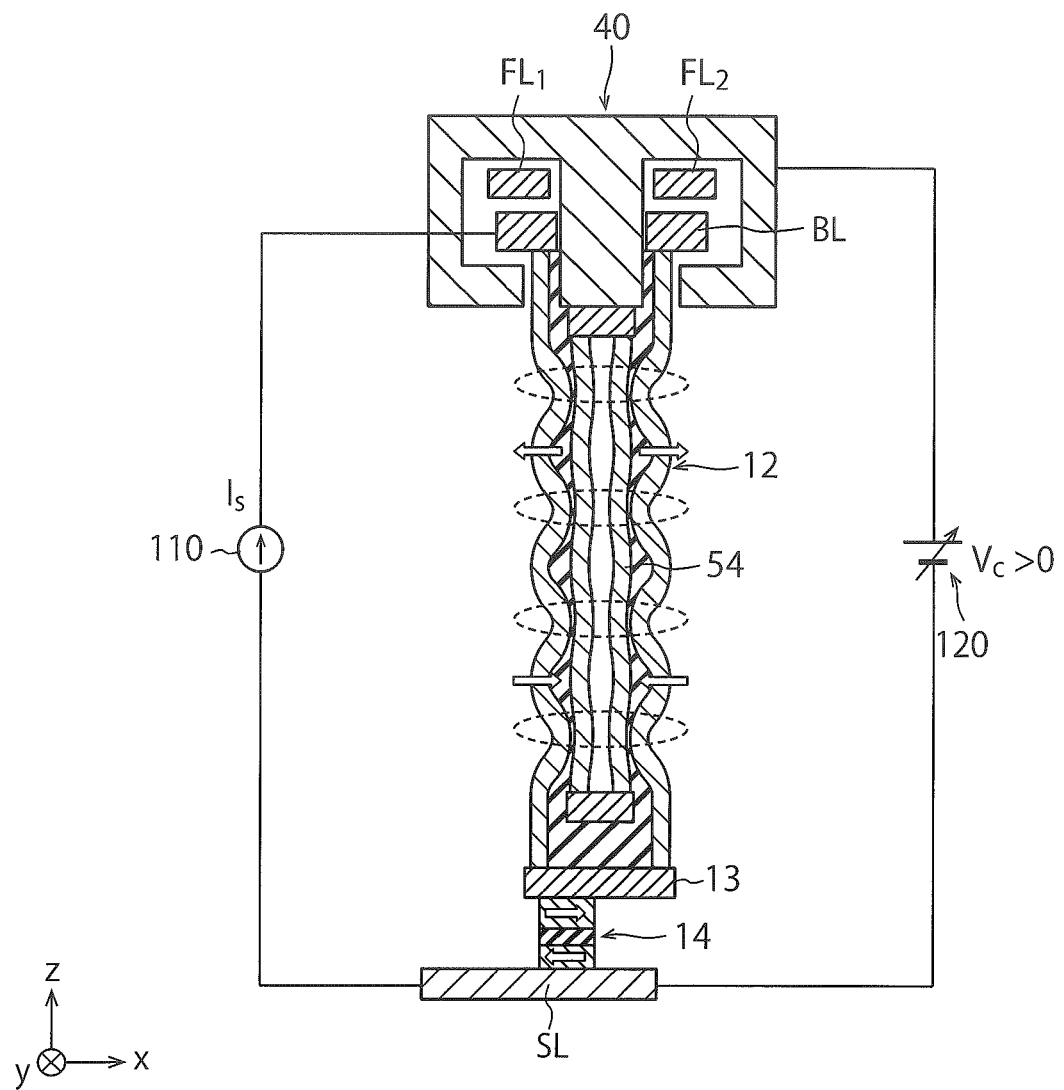

As shown in FIG. 3B for example, if the voltage Vc applied between the magnetic member 12 and the nonmagnetic conductor 54 is a positive voltage, i.e. if the potential applied to the magnetic member 12 is lower than the potential applied to the nonmagnetic conductor 54, the magnetic anisotropy of the magnetic member 12 decreases, and therefore the domain wall is more likely to move. The change in magnetic anisotropy due to the application of a voltage is disclosed in, for example, a technical paper (Nozaki, T et al., "Recent Progress in the Voltage-Controlled Magnetic Anisotropy Effect and the Challenges Faced in Developing Voltage-Torque MRAM," Micromachines 2019, 10, 327; FIG. 2 and the description related thereof).

The thickness of the portion of the insulating film 56 corresponding to the narrow portion 12d of the magnetic member 12 is thinner than the portion corresponding to the region 12c in this embodiment. Therefore, when the voltage Vc is applied, the magnetic anisotropy of the narrow portion 12d becomes greater than that of the region 12c in the magnetic member 12, and the domain wall is more likely to stop at the narrow portion 12d.

Figure 4A:
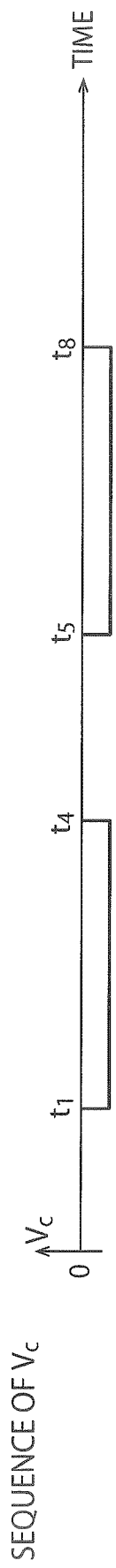
FIGS. 4A to 4C are waveform diagrams for explaining a first example of a shift operation.
Figure 4B:
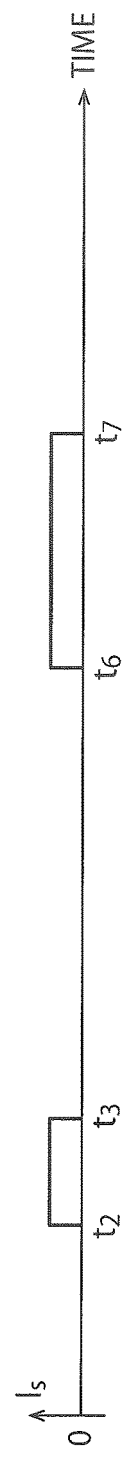
Figure 4C:
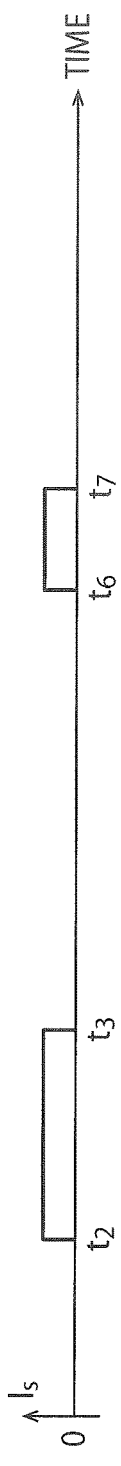

In view of the foregoing, a first example and a second example of the shift operation in the first embodiment will be described with reference to FIGS. 4A to 4C. FIG. 4A is a time chart of the voltage Vc supplied in the first example and the second example of the shift operation, and FIG. 4B is a time chart of the shift current Is supplied in the first example of the shift operation, and FIG. 4C is a time chart of the shift current Is supplied in the second example of the shift operation.

In the first example and the second example, the negative voltage Vc is applied at time t1, and the shift current Is is supplied at time t2 (>t1). At this time, the domain wall starts moving. The supply of the shift current Is stops at time t3 (>t2), and the movement of the domain wall stops. The supply of the voltage Vc stops at time t4 (>t3). The domain wall having stopped at the narrow portion 12d then moves to an adjacent narrow portion 12d in the direction of the first end portion 12a. Data of one bit stored in the region 12c or the second end portion 12b of the magnetic member 12 is shifted to an adjacent region 12c toward the first end portion 12a. Thereafter, a negative voltage Vc is supplied at time t5 (>t4), and the shift current Is is supplied at time t6 (>t5), and the domain wall starts moving. The supply of the shift current Is stops at time t7 (>t6), and the movement of the domain wall stops. The supply of the voltage Vc stops at time t8 (>t7). The domain wall having stopped at the adjacent narrow portion 12d then moves again to an adjacent narrow portion 12d in the direction of the first end portion 12a. Thus, the data of one bit having stored in in one of the regions 12c of the magnetic member 12 is shifted once more toward the first end portion 12a.

In both the first example and the second example, the shift current Is is supplied while the negative voltage, which is the voltage Vc, is being supplied. In other words, the shift current Is is supplied after the negative voltage is supplied to increase the magnetic anisotropy of the magnetic member 12 so that the domain wall is more likely to stop. Even if the pulse width (a period between t3 and t2 or between t7 and t6) of the shift current Is varies, the same shift operation result can be obtained as long as the shift current Is is supplied while the voltage Vc is being supplied. The occurrence of shift error may be prevented in this manner.

A third example of the shift operation according to the first embodiment will be described with reference to FIGS. 5A and 5B. FIG. 5A is a time chart of the voltage Vc supplied in the third example of the shift operation, and FIG. 5B is a time chart of the shift current Is supplied in the third example of the shift operation. In the third example, the polarity of the voltage Vc is changed from positive to negative while a certain level of shift current Is is supplied. For example, at time t0, a positive voltage Vc is supplied and the shift current Is is supplied. Since the positive voltage Vc is supplied, the domain wall may be moved easily. Therefore, the domain wall starts moving. At time t1 (>t0) the polarity of the voltage Vc is change from positive to negative. As a result, the domain wall is likely to stop. Data of one bit stored in one of the regions 12c of the magnetic member 12 is shifted to an adjacent region 12c in the direction of the first end portion 12a. At time t2 (>t1), the polarity of the voltage Vc is changed from negative to positive, and at time t3 (>t2), from positive to negative. During the period from time t2 to time t3, the domain wall may be moved easily. Therefore, the domain wall moves. At time t3, the voltage Vc is changed to negative. As the result, the domain wall is likely to stop. At time t4, the supply of the voltage Vc is stopped and the supply of the shift current Is is stopped. As the result, the data of one bit having been stored at the adjacent region 12c of the magnetic member 12 is shifted again to an adjacent region 12c in the direction of the first end portion 12a.

In the third example, the polarity of the voltage Vc is changed from positive to negative while a certain level of shift current flows. The third example may be used if an RC delay caused by the supply of the voltage to the nonmagnetic conductor 54 is allowed. The occurrence of shift error may also be prevented in the third example.

As the result of the shift operation, information to be read is moved to the first end portion 12a of the magnetic member 12. Information corresponding to the stray magnetic field from the first end portion 12a of the magnetic member 12 is stored in the free layer 14a of the magnetoresistive element 14. Thereafter, a read current is supplied between the bit line BL and the source line SL and the information is read based on the voltage between the free layer 14a and the fixed layer 14c of the magnetoresistive element 14.

As described above, according to the first embodiment, the nonmagnetic conductor 54 is disposed in the cylindrical form of the magnetic member 12, and the voltage Vc is supplied between the magnetic member 12 and the nonmagnetic conductor 54 during the shift operation. As the result, the occurrence of shift error may be prevented.

Since the magnetic member 12 has the regions 12c and the narrow portions 12d, the electric field generated by the voltage Vc supplied during the shift operation may be increased or decreased. As a result, the occurrence of shift error may be further prevented as compared to the case where no narrow portion is provided.

Since the magnetic member 12 has a cylindrical shape, the electric flux generated when the voltage Vc is supplied may be efficiently used. Therefore, the voltage Vc may have a relatively smaller absolute value. As a result, the occurrence of shift error may be prevented even if the magnetic memories are highly integrated.

Figure 6:
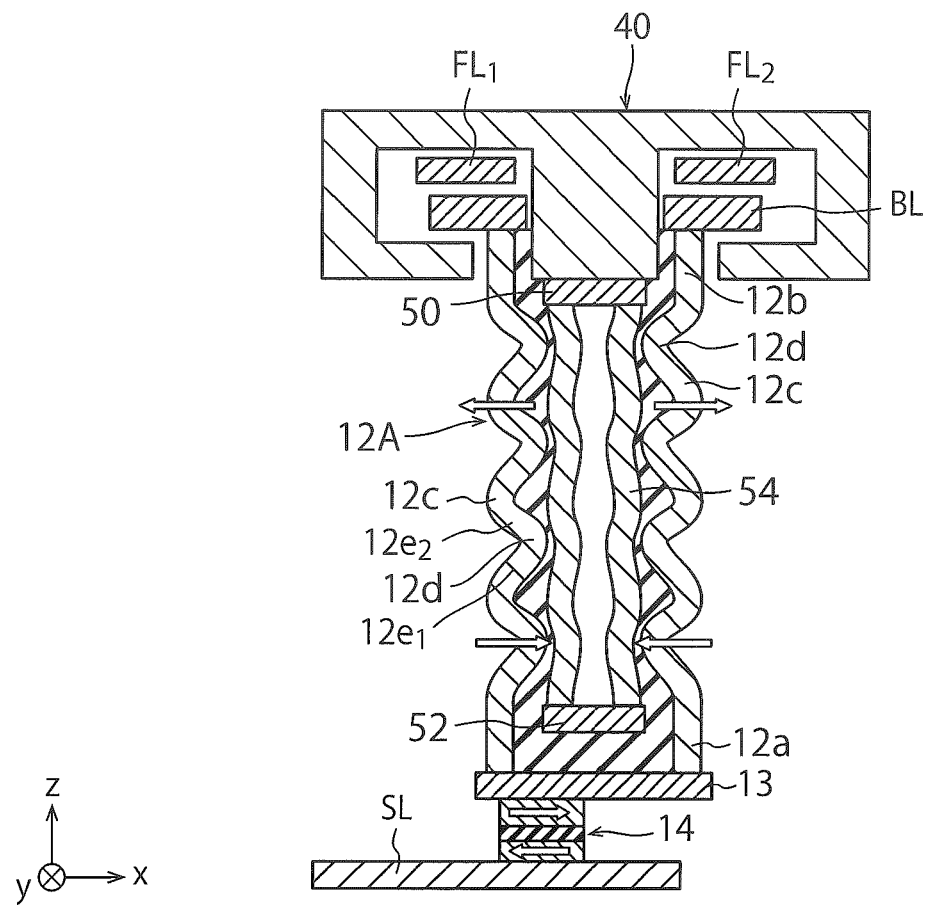
FIG. 6 is a cross-sectional view of a magnetic memory according to a modification of the first embodiment.

(Modification) FIG. 6 illustrates a magnetic memory according to a modification of the first embodiment. The magnetic memory according to the modification is obtained by replacing the magnetic member 12 included in the magnetic memory according to the first embodiment shown in FIG. 1 with a magnetic member 12A. The magnetic member 12A has an asymmetrical structure in which a first gradient $12e_1$ between one of the narrow portions 12d and a region 12c adjacent thereto on the first end portion 12a side and a second gradient $12e_2$ between the one of the narrow portions 12d and a region 12c adjacent thereto on the second end portion 12b side are different from each other. In the first embodiment described above, the first gradient is the same as the second gradient.

In FIG. 6, the first gradient $12e_1$ is gentler than the second gradient $12e_2$. In such an asymmetrical gradient structure, the domain wall is more likely to shift in the direction of a gentler gradient. Therefore, the domain wall may be controlled more reliably.

The effect of the magnetic memory according to the modification is the same as that of the first embodiment.

Second Embodiment

Figure 7:
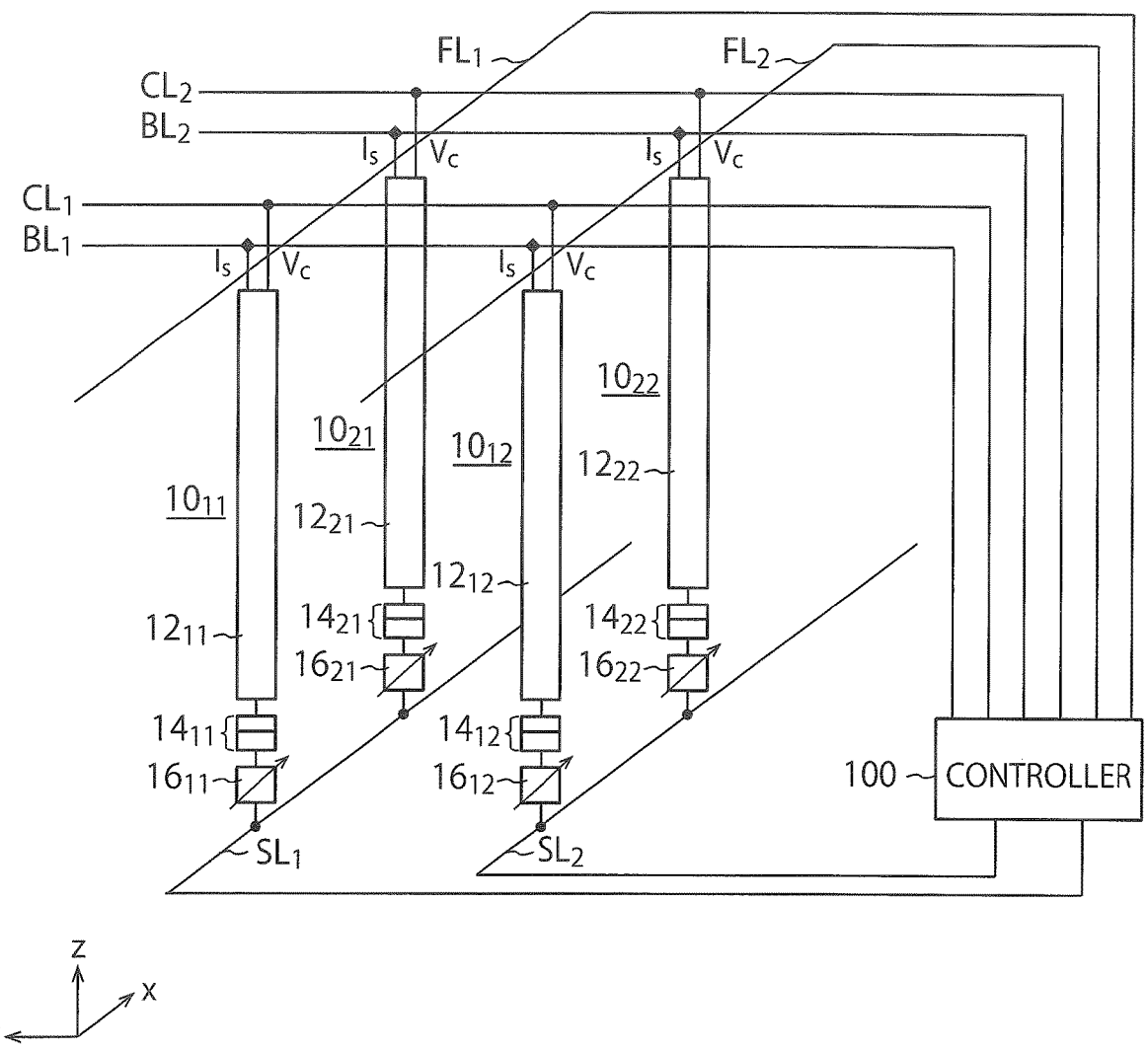
FIG. 7 is a circuit diagram showing the structure of a magnetic memory according to a second embodiment.

FIG. 7 illustrates a magnetic memory according to a second embodiment. The magnetic memory according to the second embodiment includes memory cells $10_{11}$ to $10_{22}$ arranged in an array form having two rows and two columns. Each memory cell $10_{ij}$ (i, j=1, 2) has the same structure as the memory cell 10 of the first embodiment, and includes a magnetic member $12_{ij}$ and a magnetoresistive element $14_{ij}$, one terminal of which (free layer) is electrically connected to a first end portion 12a of the magnetic member $12_{ij}$ (see FIG. 1). The other terminal (fixed layer) of the magnetoresistive element $14_{ij}$ (i, j=1, 2) is electrically connected to a source line $SL_j$ as in the first embodiment. However, in the second embodiment, a switching element $16_{ij}$ is disposed between the other terminal (fixed layer) of the magnetoresistive element $14_{ij}$ (i, j=1, 2) and the source line $SL_j$.

Each magnetic member $12_{ij}$ (i, j=1, 2) has the same structure as the magnetic member 12 of the first embodiment. A second end portion 12b of the magnetic member $12_{ij}$ (i, j=1, 2) is electrically connected to a bit line $BL_i$ (i=1, 2) (see FIG. 1). A yoke (corresponding to the yoke 40 shown in FIG. 1) that is not shown in FIG. 7 is disposed around the second end portion 12b of the magnetic member $12_{ij}$ (i, j=1, 2), and a control line $CL_i$ is electrically connected to the yoke. The control line $CL_i$ (i=1, 2) is electrically connected to a nonmagnetic conductor 54 disposed in the cylindrical form of the magnetic member $12_{ij}$ (j=1, 2) (see FIG. 1). In the second embodiment, the control line $CL_i$ (i=1, 2) and the bit line $BL_i$ (i=1, 2) extend in the same direction (in FIG. 7, the y direction). The source line $SL_j$ (j=1, 2) extends in a direction crossing the control line $CL_i$ (i=1, 2) and the bit line $BL_i$ (i=1, 2) (in FIG. 7, the x direction). However, the directions of the lines are not limited to the above case, and the control line $CL_i$ (i=1, 2) may extend in the same direction as the source line $SL_j$ for example. If a voltage Vc is applied between the bit line $BL_i$ (j=1, 2) and the control line $CL_i$ (i=1, 2), the control line $CL_i$ (i=1, 2) preferably extends in the same direction as the source line $SL_j$. However, it is also possible that the control line $CL_i$ (i=1, 2) extends in the same direction as the bit line $BL_i$ (i=1, 2), for example.

Field lines $FL_j$ (j=1, 2) to which a write current is supplied during a write operation to write information are disposed along the source line $SL_j$. A corresponding yoke surrounds a portion of each of the field lines $FL_j$ (j=1, 2). Although the field lines $FL_j$ (j=1, 2) extend in the x direction in FIG. 7. The direction of the field lines is not limited to the x direction, but may be the y direction for example, or any direction that crosses the x direction and the y direction. Furthermore, the direction of the filed lines may be changed at the yokes 40 to form a zigzag pattern.

Like the first embodiment shown in FIG. 1, the control lines $CL_i$ (i=1, 2), the bit lines $BL_i$ (i=1, 2), the source lines $SL_j$ (j=1, 2), and the field lines $FL_j$ (j=1, 2) are electrically connected to a controller 100.

Each switching element $16_{ij}$ (i, j=1, 2) may be a two-terminal switching element, for example. If a voltage that is equal to or lower than a threshold value is applied across the two terminals, the switching element $16_{ij}$ (i, j=1, 2) is in a "high resistance" state, which means an electrically nonconductive state, for example. If a voltage that is higher than the threshold value is applied across the two terminals, the switching element $16_{ij}$ (i, j=1, 2) is in a "low resistance" state, which means an electrically conductive state, for example. A switching element $16_{ij}$ (i, j=1, 2) in an ON sate keeps the state as long as a current having a value equal to or higher than a holding current value flows. The switching element $16_{ij}$ (i, j=1, 2) may have this function regardless of which polarity the voltage has. The switching element $16_{ij}$ (i, j=1, 2) may comprise at least one chalcogen element selected from a group of Te, Se, and S, or may comprise a chalcogenide, which is a compound of one or more of the above chalcogen elements. The switching element may also be formed of at least one element selected from B, Al, Ga, In, C, Si, Ge, Sn, As, P, and Sb.

The switching element $16_{ij}$ (i, j=1, 2) may be a diode or a transistor.

Although the switching element $16_{ij}$ (i, j=1, 2) is disposed between the magnetoresistive element $14_{ij}$ and the source line $SL_i$ in FIG. 7, it may be disposed between the magnetic member $12_{ij}$ and the bit line $BL_j$ as in a modification of the second embodiment shown in FIG. 23. In other words, the switching element $16_{ij}$ (i, j=1, 2) may be either disposed on the first end portion side (the source line $SL_i$ side) or the second end portion side (the bit line $BL_j$ side) of the magnetic member $12_{ij}$. The switching element $16_{ij}$ (i, j=1, 2) may disposed in the same manner in another modification of the second embodiment shown in FIG. 21 and a third embodiment shown in FIG. 8, which will be described later.

In the magnetic memory having the above-described structure, information is written to a selected memory cell $10_{ij}$ (i, j=1, 2) by supplying a write current from the controller 100 to the corresponding field line $FL_j$. As a result, the information is written to the first end portion $12a$ of the magnetic member $12_{ij}$ (i, j=1, 2) via the corresponding yoke as in the case of the first embodiment (see FIG. 1).

Information is read by supplying a voltage between the control line $CL_i$ and the bit line $BL_i$ that correspond to a selected memory cell $10_{ij}$ (i, j=1, 2), and supplying a shift current between the bit line $BL_j$ and the source line $SL_j$ by means of the controller 100. As a result, the information to be read is shifted to the first end portion $12a$ of the magnetic member $12_{ij}$. Thereafter, a read current is supplied between the bit line $BL_i$ and the source line $SL_j$ corresponding to the selected memory cell $10_{ij}$ (i, j=1, 2) by means of the controller 100, and a voltage between the free layer and the fixed layer of the magnetoresistive element $14_{ij}$ is measured. The switching element $16_{ij}$ (i, j=1, 2) prevents the read current to flow through non-selected memory cells.

The second embodiment performs the shift operation like the first embodiment, and prevents the occurrence of shift error.

Since the magnetic member $12_{ij}$ (i, j=1, 2) includes regions $12c$ and narrow portions $12d$ like the first embodiment, the electric field generated by the voltage Vc during the shift operation may be increased or decreased. The occurrence of the shift error may be prevented more reliably than the case where the narrow portions are not provided.

Since the magnetic member $12_{ij}$ (i, j=1, 2) has a cylindrical shape, the electric flux generated when the voltage Vc is supplied may be efficiently used. Therefore, the voltage Vc may have a relatively smaller absolute value. As a result, the occurrence of the shift error may be prevented even if the magnetic memories are highly integrated.

(Modification)

Figure 21:
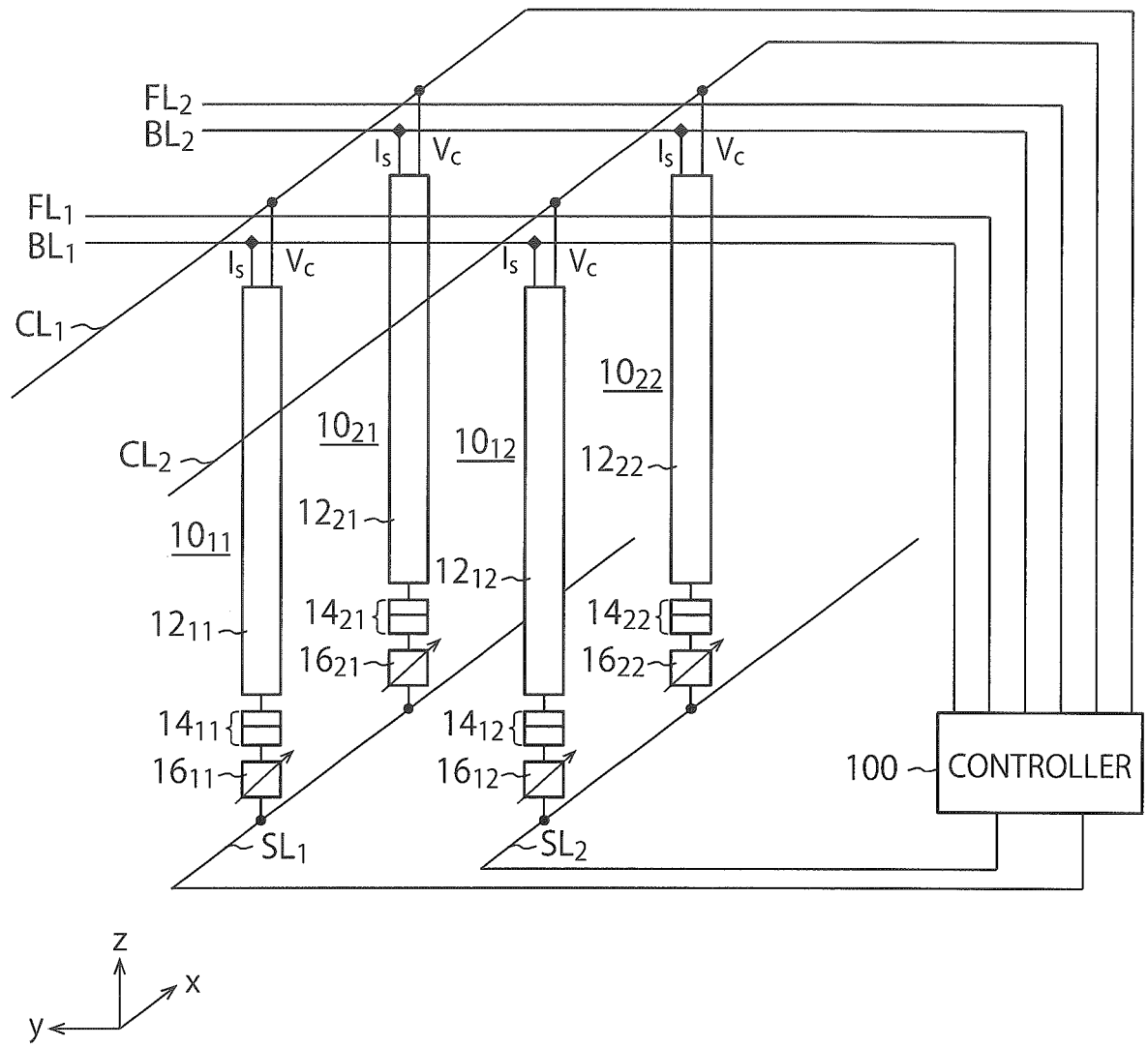
FIG. 21 is a circuit diagram showing the structure of a magnetic memory according to another modification of the second embodiment.

FIG. 21 illustrates a magnetic memory according to the modification of the second embodiment. The magnetic memory according to the modification has a structure in which the field lines $FL_1$ and $FL_2$ are disposed to extend in the same direction (y direction) as the bit lines $BL_1$ and $BL_2$, and the control lines $CL_1$ and $CL_2$ are disposed to extend in the same direction (x direction) as the source lines $SL_1$ and $SL_2$ in the magnetic memory shown in FIG. 7.

In this case, the field line $FL_1$ is used to write information to the memory cells $10_{11}$ and $10_{12}$, and the field line $FL_2$ is used to write information to the memory cells $10_{21}$ and $10_{22}$. The control line $CL_1$ is electrically connected to the second end portion $12b$ of each of the magnetic members $12_{11}$ and $12_{21}$, and the control line $CL_2$ is electrically connected to the second end portion $12b$ of each of the magnetic members $12_{12}$ and $12_{22}$.

The effect of the magnetic memory according to the modification is the same as that of the magnetic memory according to the second embodiment.

Third Embodiment

Figure 8:
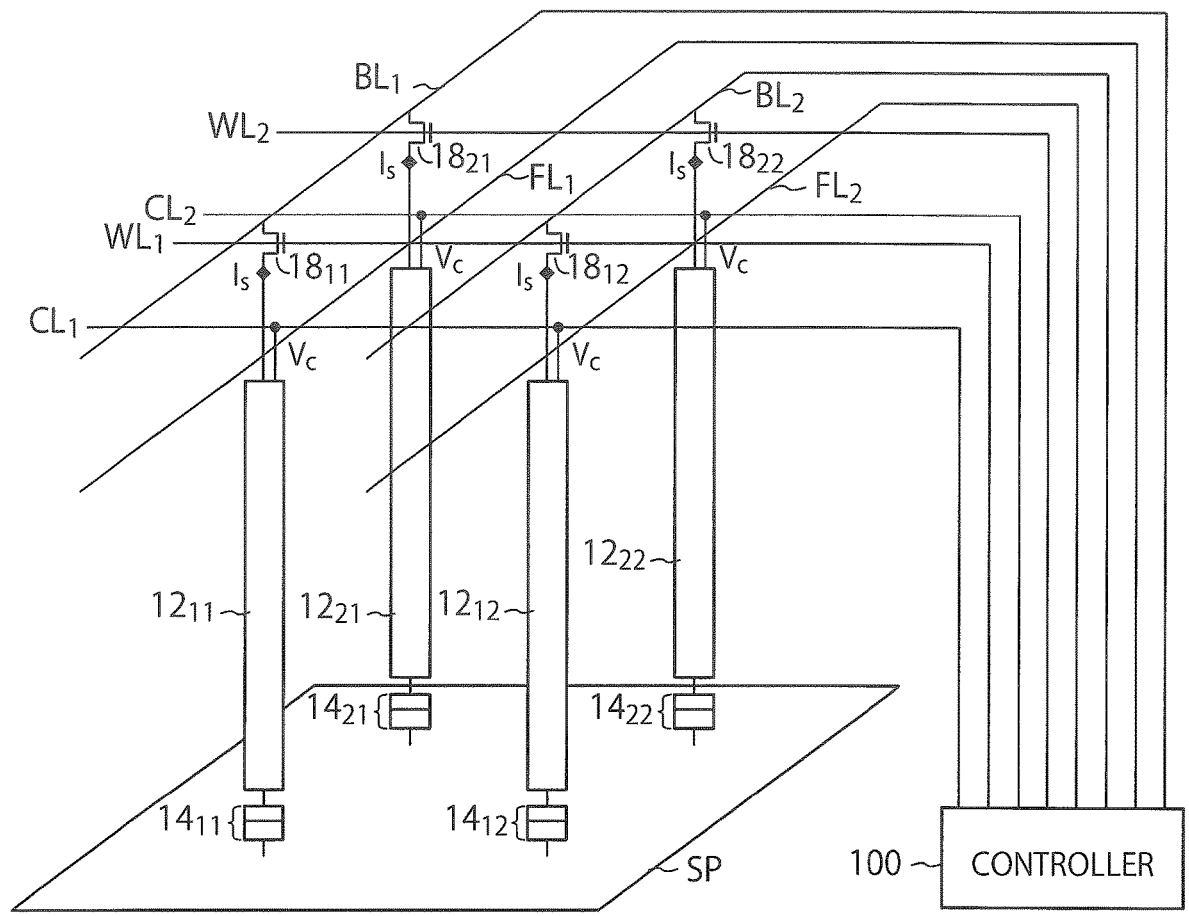
FIG. 8 is a circuit diagram showing the structure of a magnetic memory according to a third embodiment.

FIG. 8 illustrates a magnetic memory according to a third embodiment. The magnetic memory according to the third embodiment has a structure obtained by using a source plate SP instead of the source lines $SL_1$ and $SL_2$, and using a selection transistor $18_{ij}$ for selecting the corresponding memory cell $10_{ij}$ instead of the switching element $16_{ij}$ (i, j=1, 2) in the magnetic memory according to the second embodiment shown in FIG. 7. The selection transistor $18_{ij}$ (i, j=1, 2) is disposed between the second end portion $12b$ of the magnetic member $12_{ij}$ and the bit line $BL_j$ in each memory cell $10_{ij}$. The gate of the selection transistor $18_{ij}$ is electrically connected to the word line $WL_i$. The bit line $BL_j$ (j=1, 2) therefore extends in the y direction, unlike the second embodiment. The word line $WL_i$ (i=1, 2) extends in the x direction. The source plate SP is electrically connected to the fixed layer of the magnetoresistive element $14_{ij}$ in each memory cell $10_{ij}$ (i, j=1, 2). The word lines $WL_i$ (i=1, 2), the source plate SP, the control lines $CL_i$ (i=1, 2), the bit lines $BL_j$ (j=1, 2), and the field lines $FL_j$ (j=1, 2) are electrically connected to the controller 100.

The write operation of the magnetic memory according to the third embodiment is performed in the same manner as the write operation of the magnetic memory according to the second embodiment.

A read operation is performed in the third embodiment in the following manner. Information is read by driving the word line $WL_i$ (i=1, 2) corresponding to a selected memory cell $10_{ij}$ (i, j=1, 2) by means of the controller 100 to turn on the selection transistor $18_{ij}$ connected to the word line $WL_i$. Thereafter, a voltage is supplied between the control line $CL_i$ and the bit line $BL_i$ corresponding to the selected memory cell $10_{ij}$ (i, j=1, 2) and a shift current is supplied between the bit line $BL_i$ and the source plate SP by means of the controller 100. As a result, the information to be read is shifted to the first end portion $12a$ of the magnetic member $12_{ij}$. Subsequently, a read current is supplied between the bit line $BL_i$ and the source plate SP corresponding to the selected memory cell $10_{ij}$ (i, j=1, 2) by means of the controller 100, and the information is read based on the voltage between the free layer and the fixed layer of the magnetoresistive element $14_{ij}$. The selection transistor $18_{ij}$ (i, j=1, 2) prevents the read current from flowing through non-selected memory cells.

The third embodiment performs the shift operation like the first embodiment, and prevents the occurrence of a shift error.

Since the magnetic member $12_{ij}$ (i, j=1, 2) includes regions 12c and narrow portions 12d like the first embodiment, the electric field generated by the voltage Vc during the shift operation may be increased or decreased. The occurrence of the shift error may be prevented more reliably than the case where the narrow portions are not provided.

Since the magnetic member $12_{ij}$ (i, j=1, 2) has a cylindrical shape, the electric flux generated when the voltage Vc is supplied may be efficiently used. Therefore, the voltage Vc may have a relatively smaller absolute value. As a result, the occurrence of the shift error may be prevented even if the magnetic memories are highly integrated.

Fourth Embodiment

A method of manufacturing a magnetic memory according to a fourth embodiment will be described with reference to FIGS. 9 to 20. The method according to the fourth embodiment is for manufacturing a magnetic memory having a structure corresponding to that of the magnetic memory according to the first embodiment. FIGS. 9 to 20 illustrate steps of the method. The structure of the magnetic memory manufactured according to the fourth embodiment is obtained by eliminating the field line $FL_1$ and the third portion $40c_1$ and the fourth portion $40d_1$ of the yoke 40 from the magnetic memory shown in FIG. 1.

Figure 9:
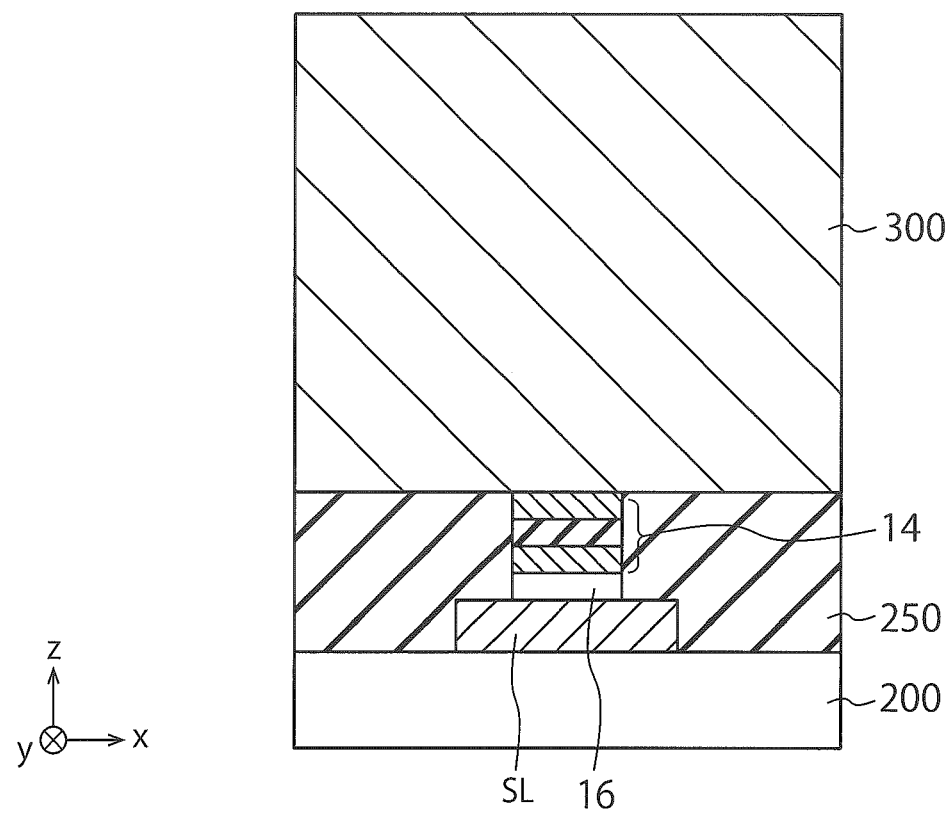
FIG. 9 is a cross-sectional view showing a step of a method of manufacturing a magnetic memory according to a fourth embodiment.

First, a source line SL is formed on a silicon substrate 200, for example, a switching element 16 is formed on the source line SL, and a magnetoresistive element 14 is formed on the switching element 16 (FIG. 9). The magnetoresistive element 14, the switching element 16, and the source line SL are covered with an insulating film 250 of silicon oxide, for example. The insulating film 250 is flattened by chemical mechanical polishing (CMP) to expose the top surface of the magnetoresistive element 14. Subsequently, a metal layer 300 of aluminum, for example, is deposited to cover the top surface of the magnetoresistive element 14 and the top surface of the insulating film 250.

Figure 10:
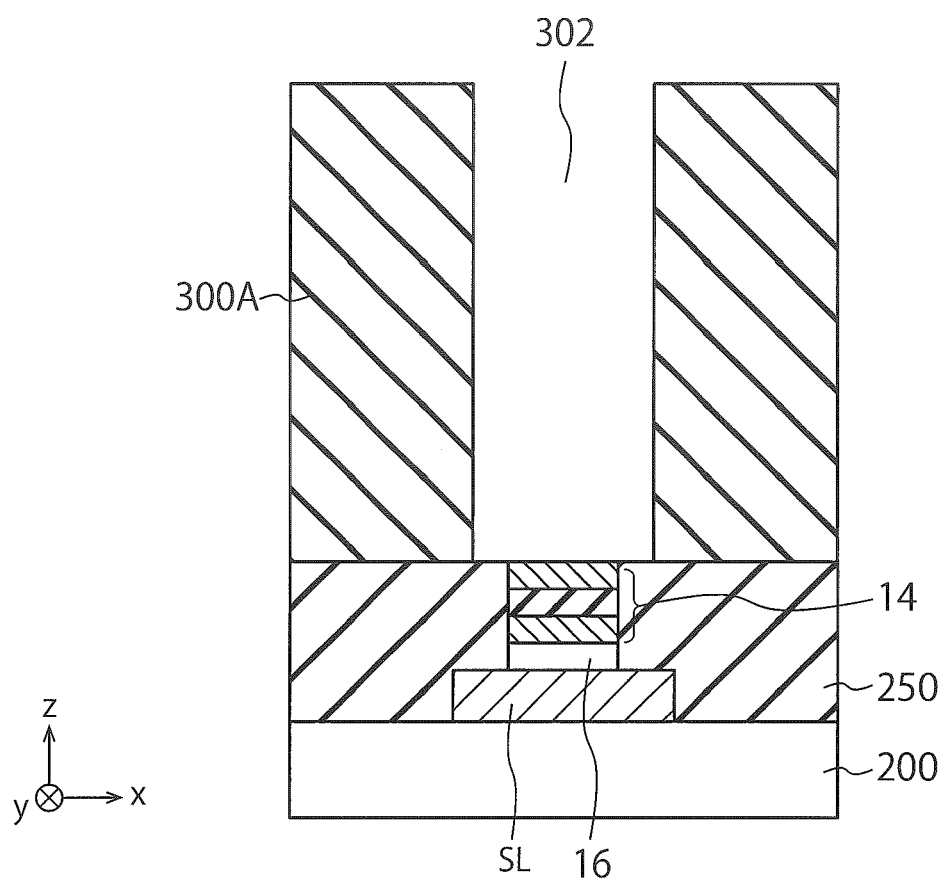
FIG. 10 is a cross-sectional view showing a step of the method of manufacturing the magnetic memory according to the fourth embodiment.

Thereafter, anode oxidation is performed on the metal layer 300. During the anode oxidation, the metal layer 300 or the substrate 200 is set as an anode, and a current is caused to flow between them in an electrolytic solution (for example, any of or any combination of sulfuric acid, oxalic acid, and phosphoric acid). The metal layer (aluminum) is then oxidized, forming metal ions and dissolving. The metal ions are combined with oxygen in the electrolytic solution to make a metal oxide (aluminum oxide), which grows on the surface of the metal layer 300. As the dissolving and the growing advance at the same time, minute holes 302 surrounded by the aluminum oxide are formed on the surface of the aluminum of the metal layer 300. The top surface of the magnetoresistive element 14 is exposed at the bottom of each hole 302. While the holes 302 are formed, a second voltage is periodically applied, the second voltage being different from the first voltage applied to form the holes. While the second voltage is applied, portions having smaller dimensions (a smaller diameter) in the x direction and the y direction indicated in FIG. 10 are formed. The portions having a smaller diameter become the narrow portions 12d shown in FIG. 1. The aluminum in the regions around the holes 302 is changed to aluminum oxide 300A (FIG. 10).

Figure 11:
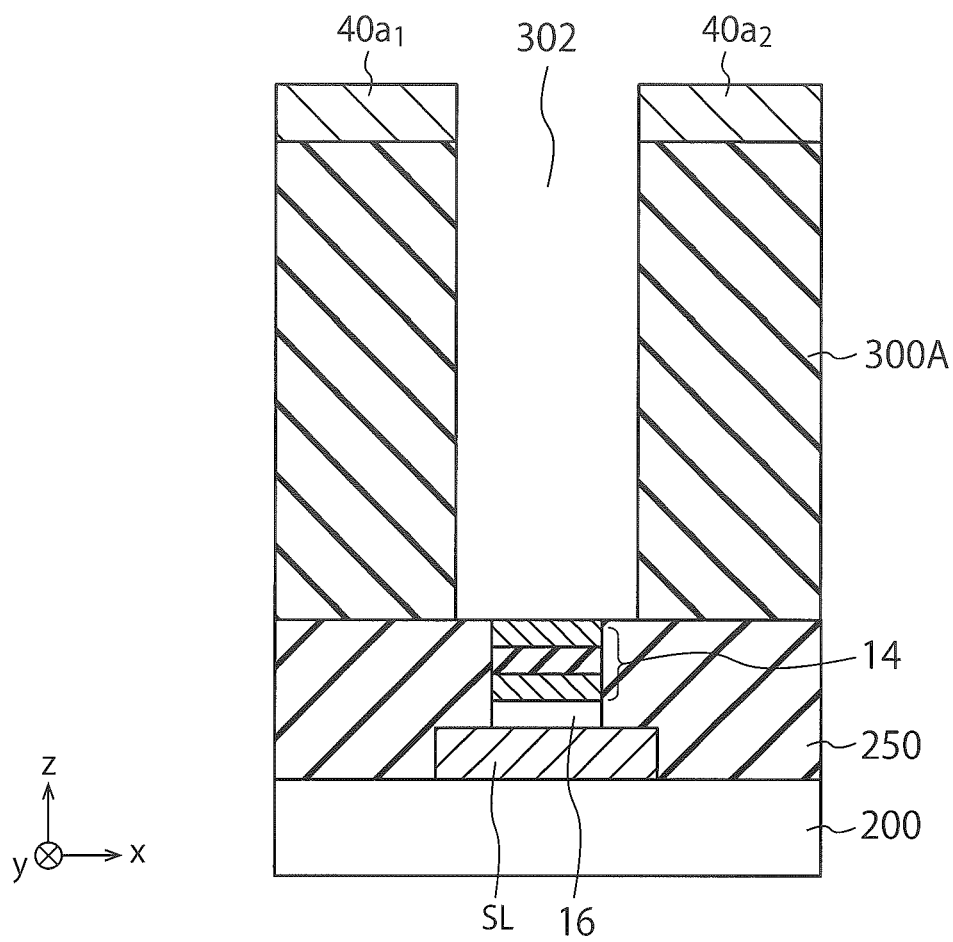
FIG. 11 is a cross-sectional view showing a step of the method of manufacturing the magnetic memory according to the fourth embodiment.

Subsequently, the first portions $40a_1$ and $40a_2$ of the yoke 40 shown in FIG. 1 are formed on the top surface of the aluminum oxide 300A. The first portions $40a_1$ and $40a_2$ are formed of NiFe, for example (FIG. 11). The above-described structure may also be formed by forming an aluminum oxide layer having minute holes 302 by anode oxidation on a substrate that is different from the substrate on which the magnetoresistive element 14, the switching element 16, and the source line SL are formed, joining the substrates, and polishing the back surface of the joined substrates.

Figure 12:
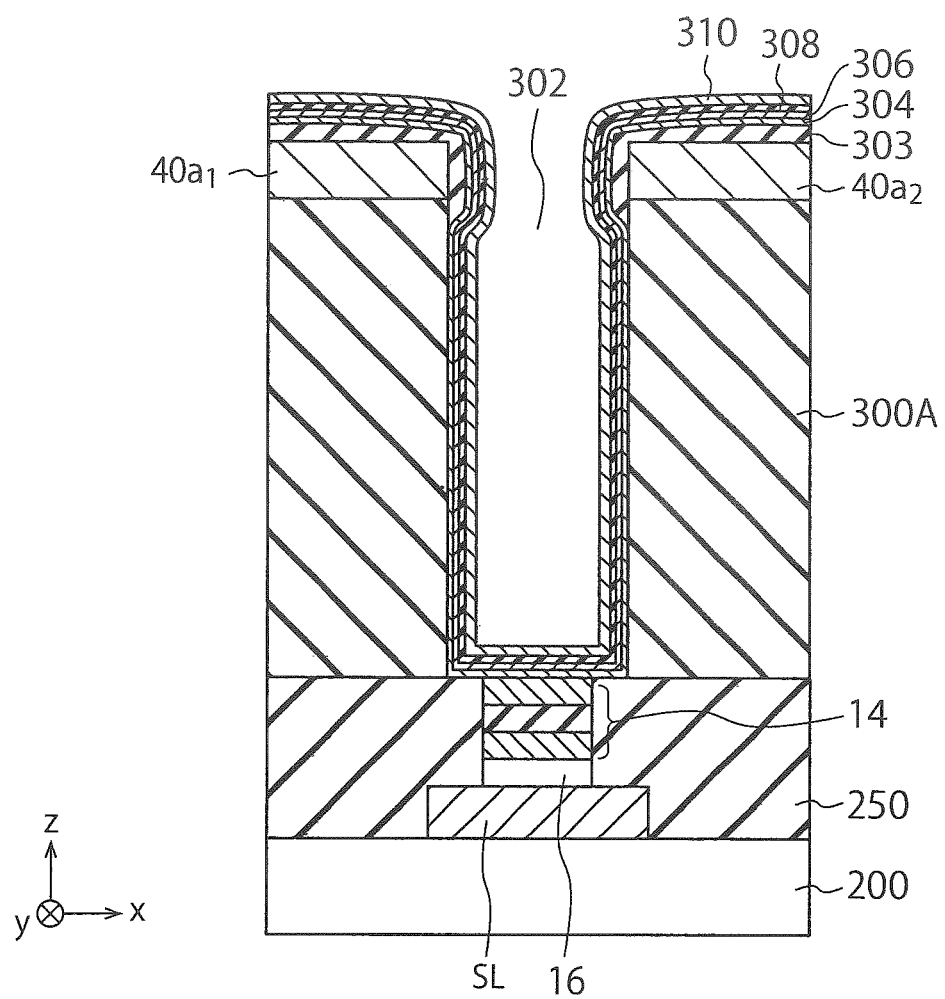
FIG. 12 is a cross-sectional view showing a step of the method of manufacturing the magnetic memory according to the fourth embodiment.

Thereafter, an insulating film 303 of silicon oxide, for example, covering the top surfaces of the first portions $40a_1$ and $40a_2$ and the side surfaces of the first portions $40a_1$ and $40a_2$ in the hole 302, is formed as shown in FIG. 12. A base layer 304 of tungsten (W), for example, covering the insulating film 303 and the bottom and the side surfaces of the hole 302 is then formed. Subsequently, a magnetic metal layer 306 to become the magnetic member 12 shown in FIG. 1 is formed to cover the base layer 304. The magnetic metal layer 306 is formed of a magnetic material containing Co and Fe, such as CoFe or CoFeB. An insulating material layer 308 of magnesium oxide, for example, is formed to cover the magnetic metal layer 306. Thereafter, a nonmagnetic metal layer 310 to become the nonmagnetic conductive layers 50 and 52 and the nonmagnetic conductor 54 shown in FIG. 1 is formed to cover the insulating material layer 308. The nonmagnetic metal layer 310 is disposed above the first portions $40a_1$ and $40a_2$, and covers the insulating material layer 308 on the bottom and the side surfaces of the hole 302.

Figure 13A:
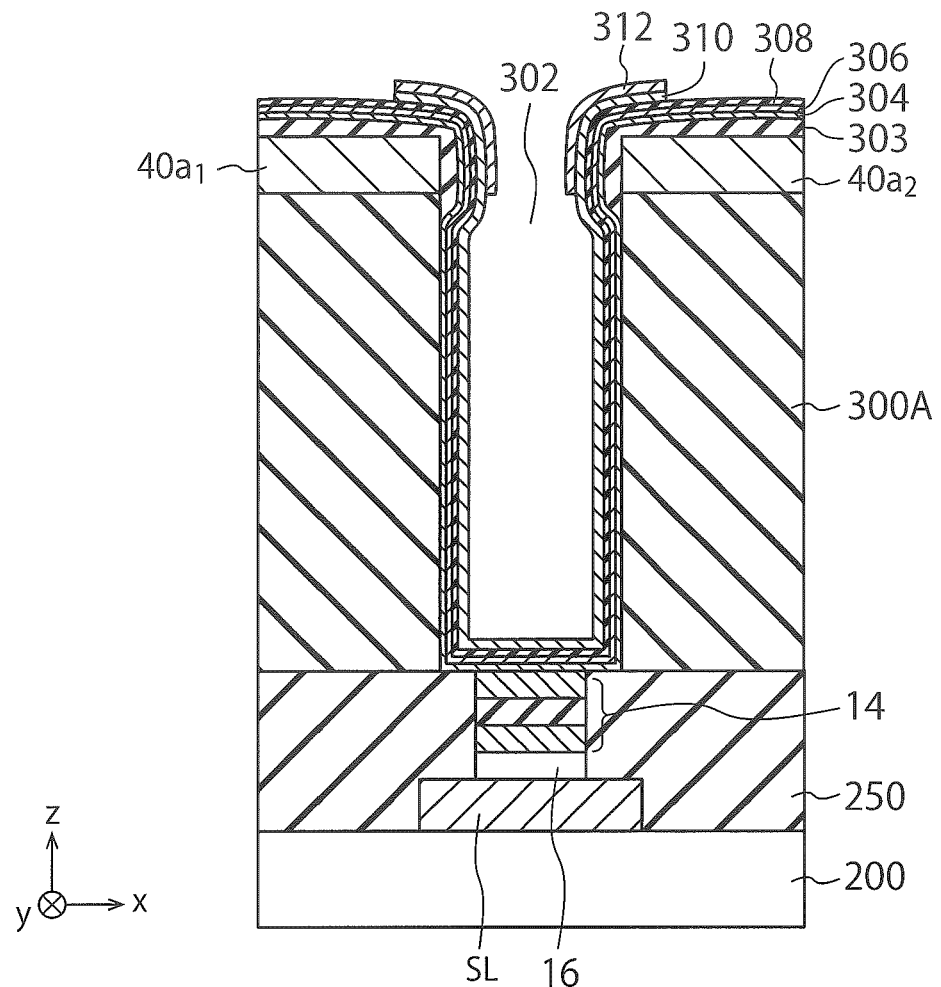
FIGS. 13A and 13B are a cross-sectional view and a plan view showing a step of the method of manufacturing the magnetic memory according to the fourth embodiment.
Figure 13B:
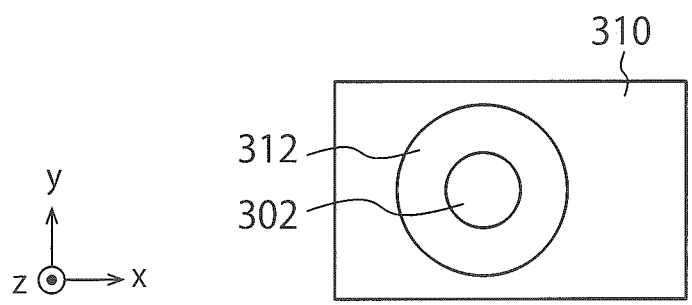

Next, as shown in FIGS. 13A and 13B, a NiFe film, for example, is deposited to cover the nonmagnetic metal layer 310 at a portion on the upper side surface of the hole 302 and above the first portions $40a_1$ and $40a_2$. The NiFe film and the nonmagnetic metal layer 310 are then patterned. As a result, the NiFe film becomes a magnetic film 312. FIG. 13B is a plan view of the workpiece shown in FIG. 13A, viewed from above. The magnetic film 312 becomes the second portion 40b of the yoke 40 shown in FIG. 1.

Figure 14:
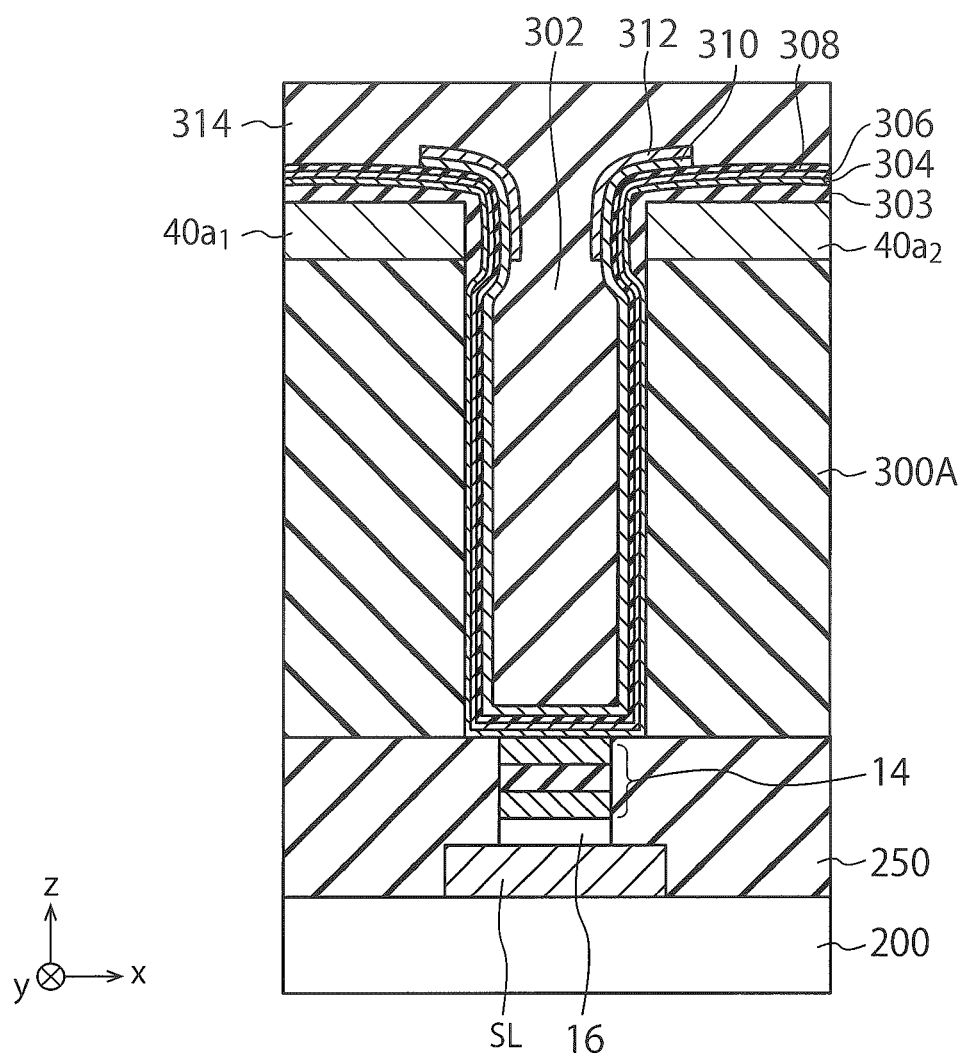
FIG. 14 is a cross-sectional view showing a step of the method of manufacturing the magnetic memory according to the fourth embodiment.
Figure 15:
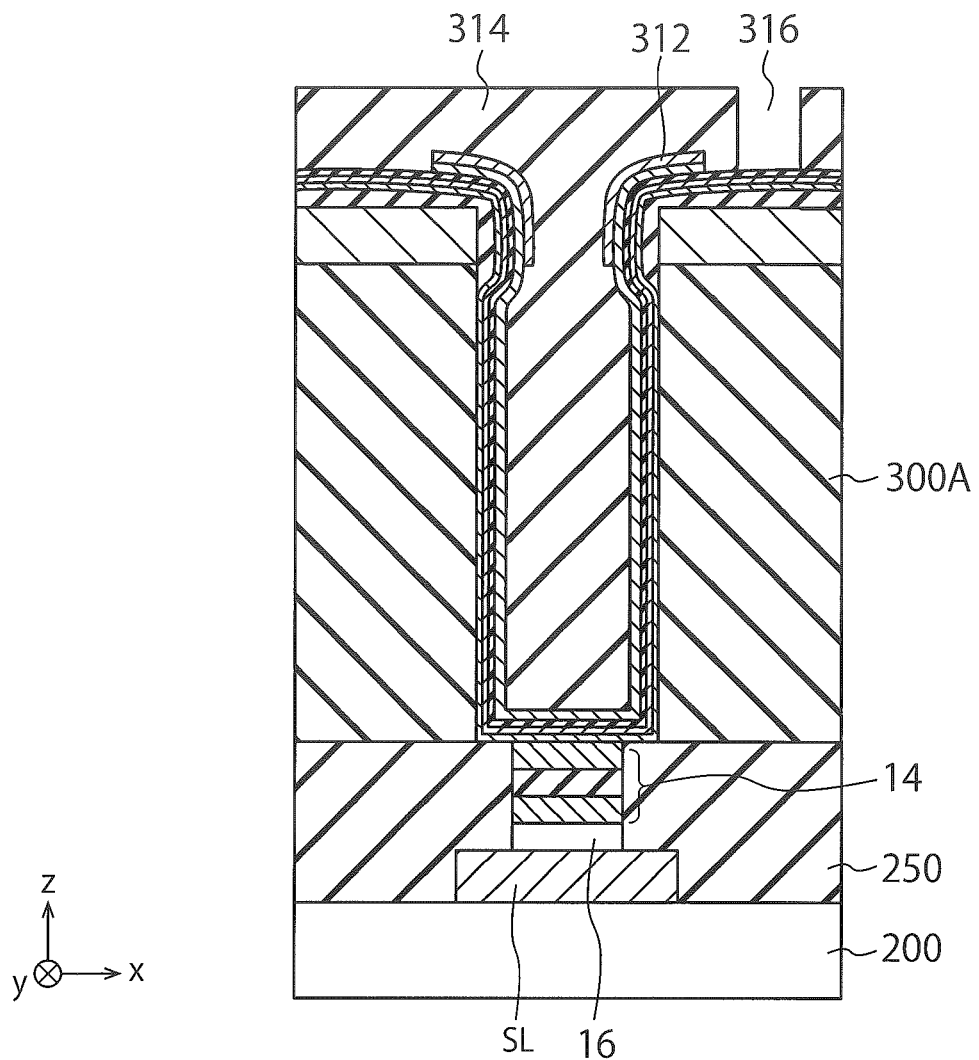
FIG. 15 is a cross-sectional view showing a step of the method of manufacturing the magnetic memory according to the fourth embodiment.
Figure 16A:
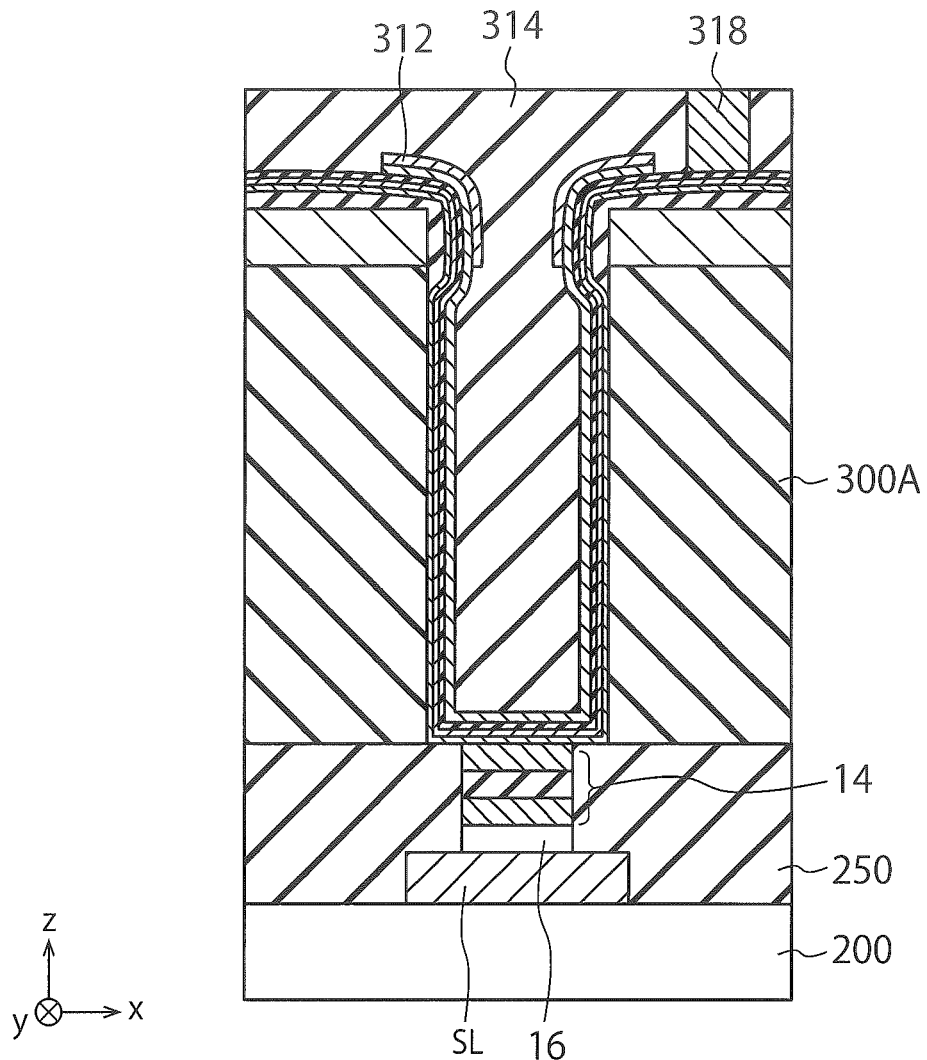
FIGS. 16A and 16B are a cross-sectional view and a plan view showing a step of the method of manufacturing the magnetic memory according to the fourth embodiment.
Figure 16B:
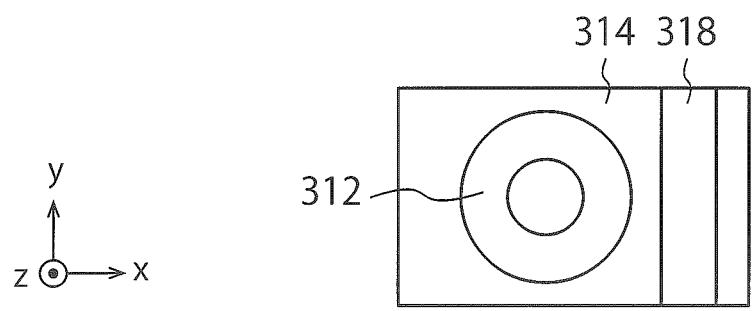

Thereafter, as shown in FIG. 14, an insulating film 314 of silicon oxide, for example, is formed to fill in the hole 302. An opening 316 connecting to the insulating material layer 308 above the first portion $40a_2$ is formed in the insulating film 314 as shown in FIG. 15. The opening 316 is then filled with a wiring 318 containing tungsten (W) using a damascene method, as shown in FIGS. 16A and 16B. FIG. 16B is a plan view of the workpiece shown in FIG. 16A, viewed from above. The wiring 318 extends in the y direction as shown in FIG. 16B, and becomes the field line shown in FIG. 1. The field line (wiring) 318 formed in the fourth embodiment is connected to the insulating material layer 308, but not connected to, and electrically insulated from the magnetic metal layer 306 that will become the magnetic member 12 shown in FIG. 1.

Figure 17:
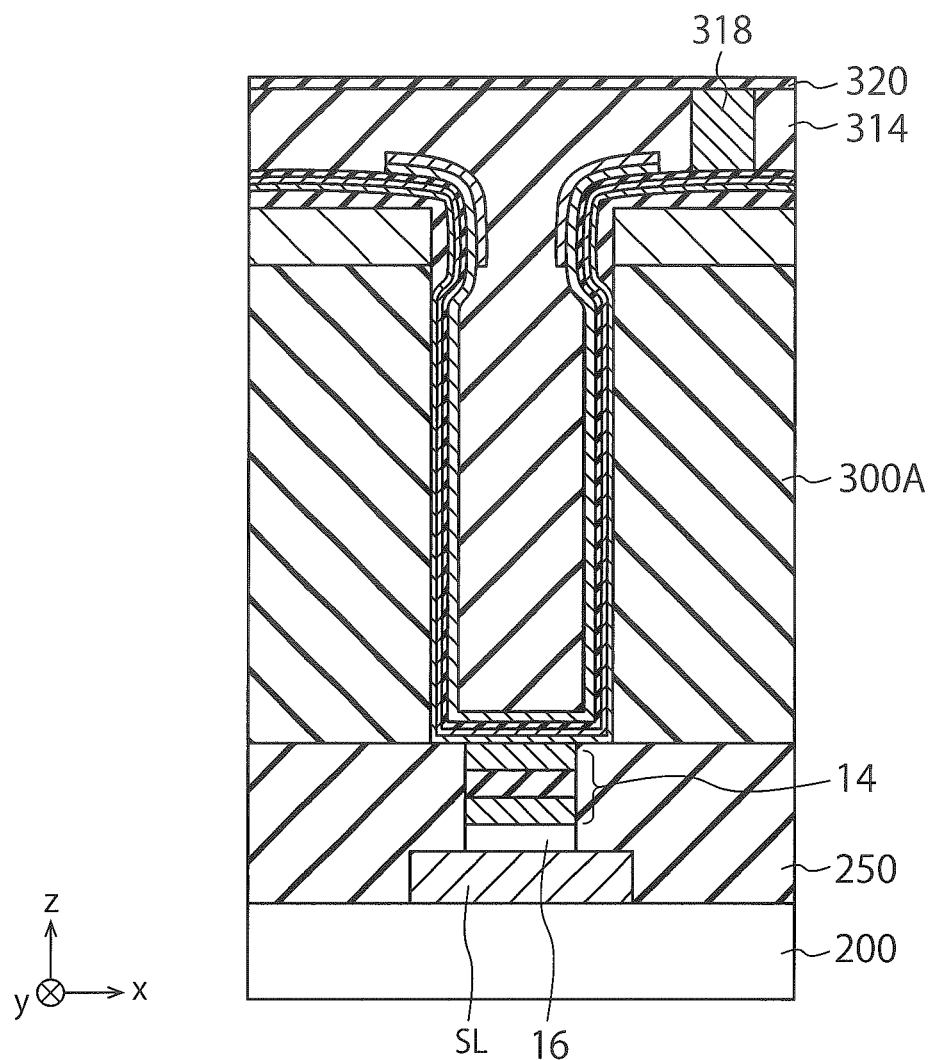
FIG. 17 is a cross-sectional view showing a step of the method of manufacturing the magnetic memory according to the fourth embodiment.
Figure 18:
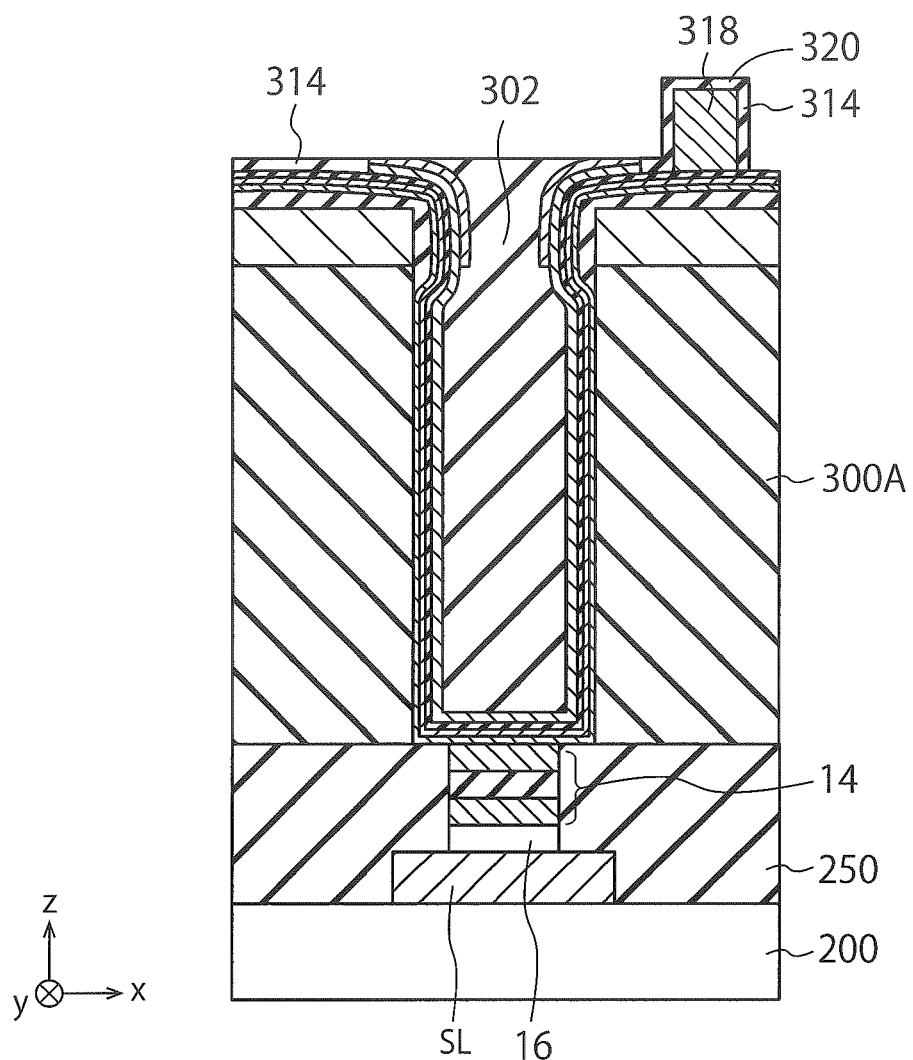
FIG. 18 is a cross-sectional view showing a step of the method of manufacturing the magnetic memory according to the fourth embodiment.
Figure 19A:
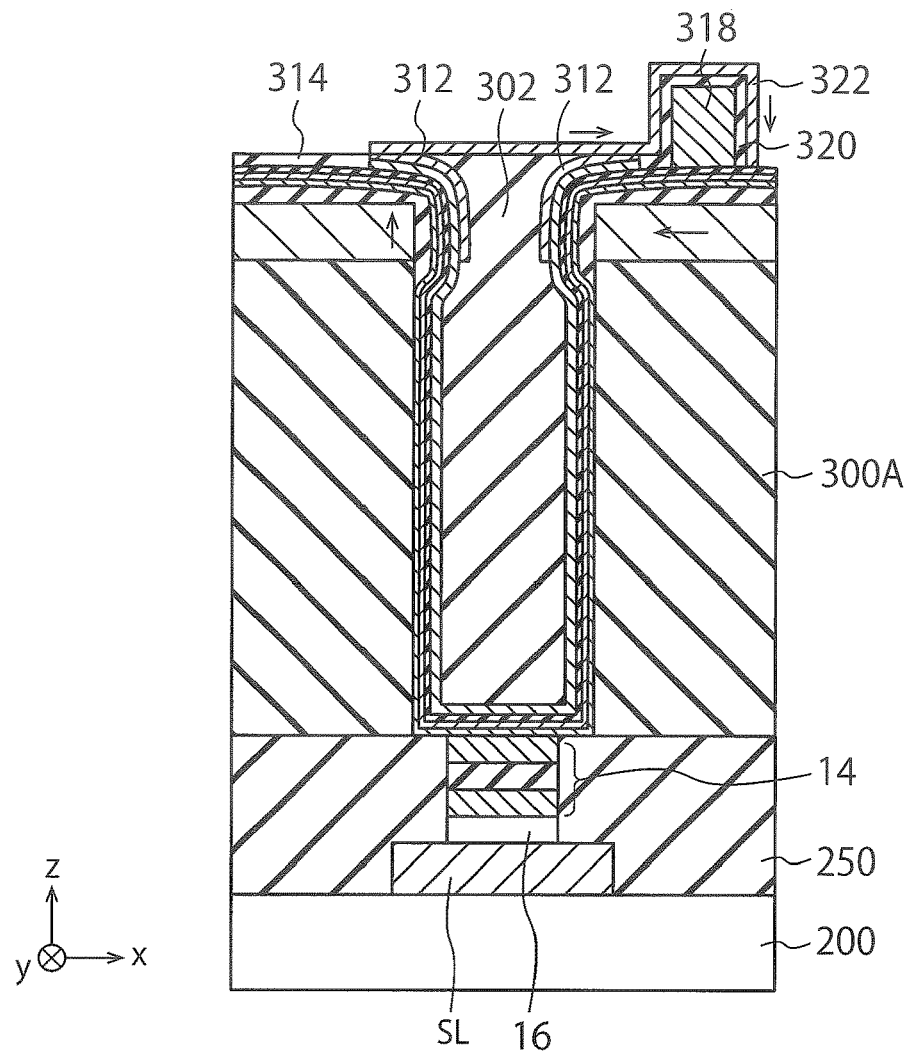
FIGS. 19A and 19B are a cross-sectional view and a plan view showing a step of the method of manufacturing the magnetic memory according to the fourth embodiment.
Figure 19B:
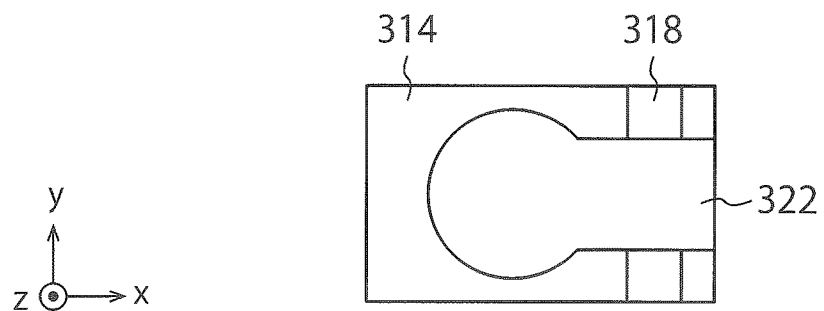

Next, as shown in FIG. 17, an insulating film 320 of silicon oxide, for example, is formed to cover the wiring 318. Thereafter, a mask (not shown) of a resist, for example, is formed on the insulating film 320 above the metal film 318, and the insulating film 320 and the insulating film 314 are etched back by anisotropic etching, for example reactive ion etching (RIE), leaving the insulating film 320 on the top surface or the metal film 318 and the insulating film 314 on the side surfaces thereof. The insulating film 314 is also left in the regions other than the inside of the hole 302 and the region where the magnetic film 312 is formed. The mask is then removed, and a magnetic film 322 of NiFe, for example, is formed to cover a portion of the wiring 318 and the magnetic film 312 as shown in FIGS. 19A and 19B. FIG. 19B is a plan view of the workpiece shown in FIG. 19A viewed from above.

With the above-described structure, a magnetic circuit is formed when a write current flows through the field line 318. The magnetic circuit includes the magnetic film 322, the first portions $40a_1$ and $40a_2$, and the magnetic film 312. If, for example, a current flows through the field line 318 from the near side to the depth side of FIG. 19A (from the bottom to the top of FIG. 19B), the magnetic field lines of the magnetic field induced by the field line 318 flow along the magnetic film 322 on the right side of the field line 318, the first portion $40a_2$ on the right side of the hole 302 shown in FIG. 19A, the first portion $40a_1$ on the left side of the hole 302, and the magnetic film 322 on the first portion $40a_1$ on the left side of the hole 302, as indicated by arrows in FIG. 19A. The magnetic field lines may also branch from the first portion $40a_2$ into the magnetic film 312, and further the magnetic film 322 on the magnetic film 312. If the write current flows through the field line 318 from the depth side to the near side of FIG. 19A (from the top side to the bottom side in FIG. 19B), the magnetic field lines flow in the opposite direction as has been described above. The magnetic field lines flow through the region of the second end portion 12b of the magnetic member 12 shown in FIG. 1 (magnetic metal layer 306), and information (magnetization direction) is written to the second end portion 12b of the magnetic member 12.

Figure 20:
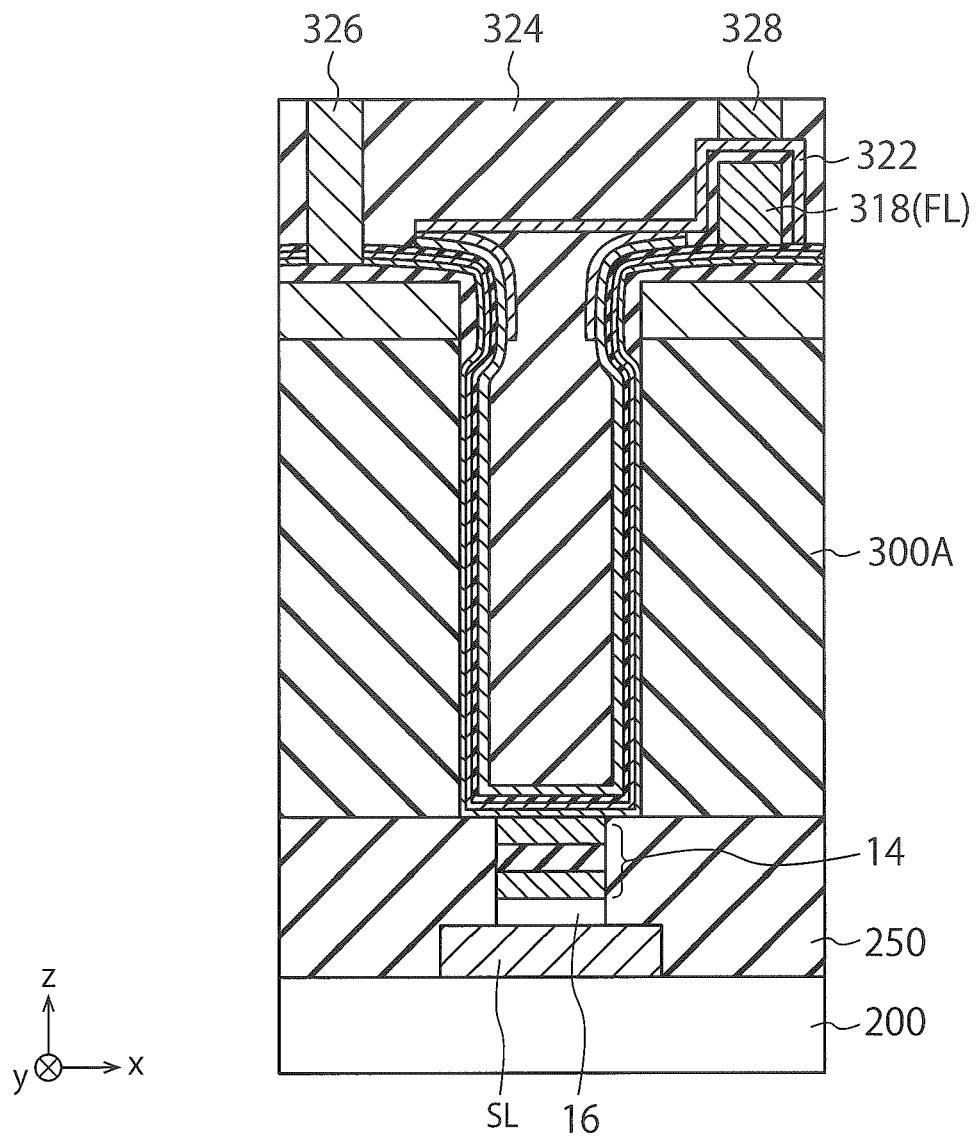
FIG. 20 is a cross-sectional view showing a step of the method of manufacturing the magnetic memory according to the fourth embodiment.

Thereafter, an insulating film 324 of silicon oxide, for example, is deposited as shown in FIG. 20, and an opening connecting to the magnetic metal layer 306 and an opening connecting to the magnetic film 322 are formed in the insulating film 324. Subsequently, the openings are filled with a metal to form a wiring 326 and a wiring 328. The wiring 326 corresponds to the bit line BL shown in FIG. 1, and the wiring 328 corresponds to a voltage control line for applying a voltage to the yoke 40 shown in FIG. 2.

The magnetic memory manufactured according to the fourth embodiment includes the nonmagnetic conductor 54 (nonmagnetic metal layer 310) in the cylinder of the magnetic member 12 (magnetic metal layer 306), and supplies a voltage Vc between the magnetic member 12 and the nonmagnetic conductor 54 during a shift operation, thereby preventing the occurrence of the shift error, like the first embodiment.

As in the case of the first embodiment, the magnetic member 12 includes regions 12c and narrow portions 12d. Therefore, the electric field generated by the voltage Vc supplied during the shift operation may be increased or decreased. The occurrence of shift error may be prevented more reliably as compared to the case where no narrow portion is provided.

Since the magnetic member 12 has a cylindrical shape, like the first embodiment, the electric flux generated when the voltage Vc is supplied may be efficiently used. Therefore, the voltage Vc may have a relatively smaller absolute value. As a result, the occurrence of shift error may be prevented even if the magnetic memories are highly integrated.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
   a first wiring and a second wiring;
   a third wiring provided separately from the first wiring and the second wiring;
   a nonmagnetic conductor extending in a first direction and electrically connected to the third wiring;
   a first magnetic member including a first portion electrically connected to the first wiring and a second portion electrically connected to the second wiring, the first magnetic member extending in the first direction from the first portion to the second portion to surround the nonmagnetic conductor;
   a first insulation portion disposed between the nonmagnetic conductor and the first magnetic member; and
   a controller electrically connected to the first wiring, the second wiring, and the third wiring.

2. The magnetic memory according to claim 1, further comprising:
   a fourth wiring, a second insulation portion being disposed between the fourth wiring and the second portion of the first magnetic member; and
   a second magnetic member covering a portion of the fourth wiring and electrically connected to the nonmagnetic conductor,
   wherein the controller is electrically connected to the fourth wiring.

3. The magnetic memory according to claim 2, further comprising a first magnetoresistive element disposed between the first portion and the first wiring,
   wherein the first wiring extends in a second direction that crosses the first direction, the second wiring extends in a third direction that crosses the first direction and the second direction, and the fourth wiring extends along a plane formed by the second direction and the third direction.

4. The magnetic memory according to claim 1, further comprising a fourth wiring that applies a magnetic field to the first magnetic member when a current flows through the fourth wiring,
   wherein the controller is electrically connected to the fourth wiring.

5. The magnetic memory according to claim 1, wherein during a period of time including a period of time in which the controller supplies a current between the first wiring and the second wiring, the controller supplies a voltage between the nonmagnetic conductor and the first magnetic member.

6. The magnetic memory according to claim 1, wherein during a period of time in which the controller supplies a current between the first wiring and the second wiring, the controller alternately supplies a first voltage and a second voltage between the nonmagnetic conductor and the first magnetic member, a potential of the first voltage applied to the nonmagnetic conductor being higher than a potential applied to the first magnetic member, and a potential of the second voltage applied to the nonmagnetic conductor being lower than a potential applied to the first magnetic member.

7. The magnetic memory according to claim 1, wherein:
   the first magnetic member includes a third portion, a fourth portion, a fifth portion, and a sixth portion arranged in the first direction between the first portion and the second portion, each of the third portion, the fourth portion, the fifth portion, and the sixth portion surrounding the nonmagnetic conductor, the fourth portion being deposed between the third portion and the sixth portion, the fifth portion being disposed between the fourth portion and the sixth portion; and wherein in a cross section taken along the first direction and including the first magnetic member, the nonmagnetic conductor, and the first insulation portion, a length between a first end portion and a second end portion of the third portion in a direction perpendicular to the first direction is denoted as a first distance, a length between a third end portion and a fourth end portion of the fourth portion in the direction perpendicular to the first direction is denoted as a second distance, a length between a fifth end portion and a sixth end portion of the fifth portion in the direction perpendicular to the first direction is denoted as a third distance, and a length between a seventh end portion and an eighth end portion of the sixth portion in the direction perpendicular to the first direction is denoted as a fourth distance, the first distance and the third distance are longer than the second distance and the fourth distance.

8. The magnetic memory according to claim 1, wherein in a cross section that is perpendicular to the first direction, an outer shape of the first magnetic member is a circle, an oval, or a polygon.

9. A magnetic memory comprising:
a conductive layer extending along a plane including a first direction and a second direction that crosses the first direction;
a first wiring and a second wiring extending in the second direction;
a first nonmagnetic conductor disposed along a third direction that crosses the first direction and the second direction;
a second nonmagnetic conductor disposed along the third direction;
a first magnetic member including a first portion electrically connected to the conductive layer and a second portion electrically connected to the first wiring, the first magnetic member extending in the third direction from the first portion to the second portion to surround the first nonmagnetic conductor;
a second magnetic member including a third portion electrically connected to the conductive layer and a fourth portion electrically connected to the second wiring, the second magnetic member extending in the third direction from the third portion to the fourth portion to surround the second nonmagnetic conductor;
a first insulation portion disposed between the first nonmagnetic conductor and the first magnetic member;
a second insulation portion disposed between the second nonmagnetic conductor and the second magnetic member;
a third wiring extending along the plane including the first direction and the second direction, the third wiring applying a magnetic field to the first magnetic member when a current flows through the third wiring;

a fourth wiring extending along the plane, the fourth wiring applying a magnetic field to the second magnetic member when a current flows through the fourth wiring;
a fifth wiring electrically connected to the first nonmagnetic conductor and the second nonmagnetic conductor and extending in the first direction; and
a controller electrically connected to the first wiring, the second wiring, the third wiring, the fourth wiring, and the fifth wiring.

10. The magnetic memory according to claim 9, further comprising:
a first transistor disposed between the first wiring and the second portion;
a second transistor disposed between the second wiring and the fourth portion; and
a sixth wiring including a first gate of the first transistor and a second gate of the second transistor,
wherein the controller is electrically connected to the sixth wiring.

11. The magnetic memory according to claim 9, further comprising:
a third magnetic member covering a portion of the third wiring and electrically connected to the fifth wiring and the first nonmagnetic conductor; and
a fourth magnetic member covering a portion of the fourth wiring and electrically connected to the fifth wiring and the second nonmagnetic conductor.

12. The magnetic memory according to claim 9, wherein during a period of time including a period of time in which the controller supplies a current between the first wiring corresponding to the first magnetic member and the conductive layer, the controller supplies a voltage between the fifth wiring and the first wiring or between the fifth wiring and the conductive layer.

13. The magnetic memory according to claim 9, wherein during a period of time in which the controller supplies a current between the first wiring corresponding to the first magnetic member and the conductive layer, the controller alternately supplies a first voltage and a second voltage between the first wiring and the fifth wiring or between the conductive layer and the fifth wiring, a potential of the first voltage applied to the first nonmagnetic conductor being higher than a potential applied to the first magnetic member, and a potential of the second voltage being applied to the first nonmagnetic conductor being lower than a potential applied to the first magnetic member.

14. The magnetic memory according to claim 9, further comprising:
a first magnetoresistive element disposed between the first portion and the conductive layer; and
a second magnetoresistive element disposed between the third portion and the conductive layer.

* * * * *